US008749278B2

(12) United States Patent
Saotome et al.

(10) Patent No.: US 8,749,278 B2
(45) Date of Patent: Jun. 10, 2014

(54) SEMICONDUCTOR DEVICE DRIVING UNIT AND METHOD

(75) Inventors: Koji Saotome, Tochigi (JP); Yoshinari Tsukada, Tochigi (JP); Masatoshi Goto, Tochigi (JP); Yusuke Takeuchi, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 323 days.

(21) Appl. No.: 13/198,759

(22) Filed: Aug. 5, 2011

(65) Prior Publication Data

US 2012/0032709 A1    Feb. 9, 2012

(30) Foreign Application Priority Data

Aug. 9, 2010  (JP) .................................. 2010-178785
Aug. 9, 2010  (JP) .................................. 2010-178786
Aug. 9, 2010  (JP) .................................. 2010-178787

(51) Int. Cl.
*H03K 3/00* (2006.01)

(52) U.S. Cl.
USPC ........................................................ 327/109

(58) Field of Classification Search
None
See application file for complete search history.

(56) References Cited

U.S. PATENT DOCUMENTS

| 3,999,086 A | 12/1976 | Ekelund |
| 4,651,267 A | 3/1987 | Nguyen et al. |
| 4,970,635 A | 11/1990 | Shekhawat et al. |
| 5,390,070 A | 2/1995 | Niedermeier |
| 5,565,806 A * | 10/1996 | Cordini et al. ................. 327/108 |
| 5,801,458 A | 9/1998 | Marks |
| 5,926,012 A | 7/1999 | Takizawa et al. |
| 7,570,085 B2 * | 8/2009 | Ishikawa et al. .............. 327/108 |
| 2007/0222485 A1 * | 9/2007 | Ueda .............................. 327/108 |
| 2008/0204087 A1 * | 8/2008 | Schwarzer .................... 327/109 |
| 2010/0008113 A1 | 1/2010 | Kuno et al. |

FOREIGN PATENT DOCUMENTS

| JP | 03-293814 | 12/1991 |
| JP | 10-150764 | 6/1998 |
| JP | 2000-134075 | 5/2000 |
| JP | 2005-278274 | 10/2005 |
| JP | 2007-306166 | 11/2007 |
| JP | 2008-078816 | 4/2008 |
| WO | 90/06611 | 6/1990 |
| WO | 2004/008601 | 1/2004 |
| WO | 2008/032113 | 3/2008 |

OTHER PUBLICATIONS

Japanese Office Action dispatched on Oct. 8, 2013, 2 pages.
Japanese Office Action dispatched on Oct. 15, 2013, 2 pages.
Japanese Office Action dispatched on Oct. 22, 2013, 2 pages.
European Office action dated Mar. 31, 2014 (English text).

* cited by examiner

*Primary Examiner* — Lincoln Donovan
*Assistant Examiner* — Khareem E Almo
(74) *Attorney, Agent, or Firm* — Rankin, Hill & Clark LLP

(57) ABSTRACT

A turn-off feedback unit (23OFF) of a semiconductor device driving unit generates a feedback voltage as part of a voltage of a drive signal for establishing electrical continuity or disconnection in a bus according to a temporal variation of a collector current of a first semiconductor device (11U) when the first semiconductor device (11U) is turned off from on. A turn-on feedback unit (23ON) generates the feedback voltage according to a commutation current flowing through a free wheeling diode (12D) connected to a second semiconductor device (11D) when the first semiconductor device (11U) is turned on from off.

7 Claims, 20 Drawing Sheets

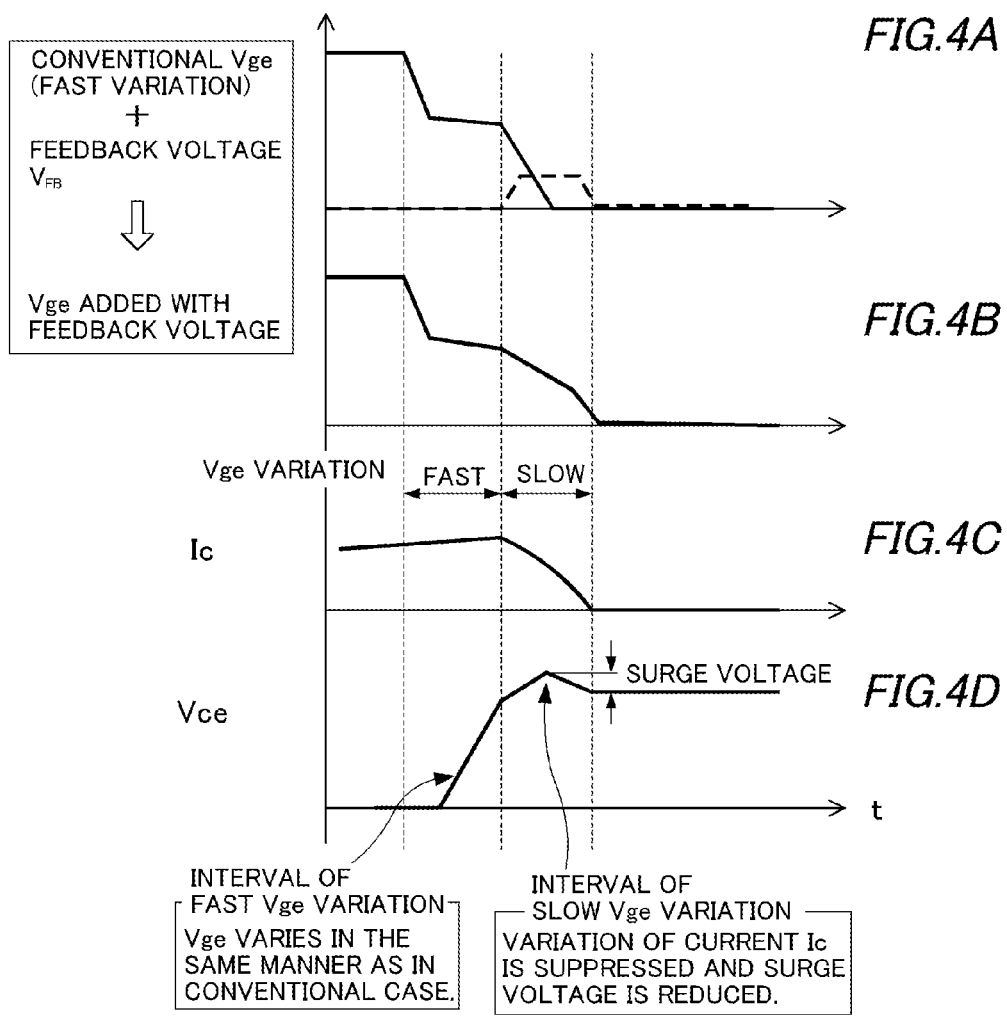

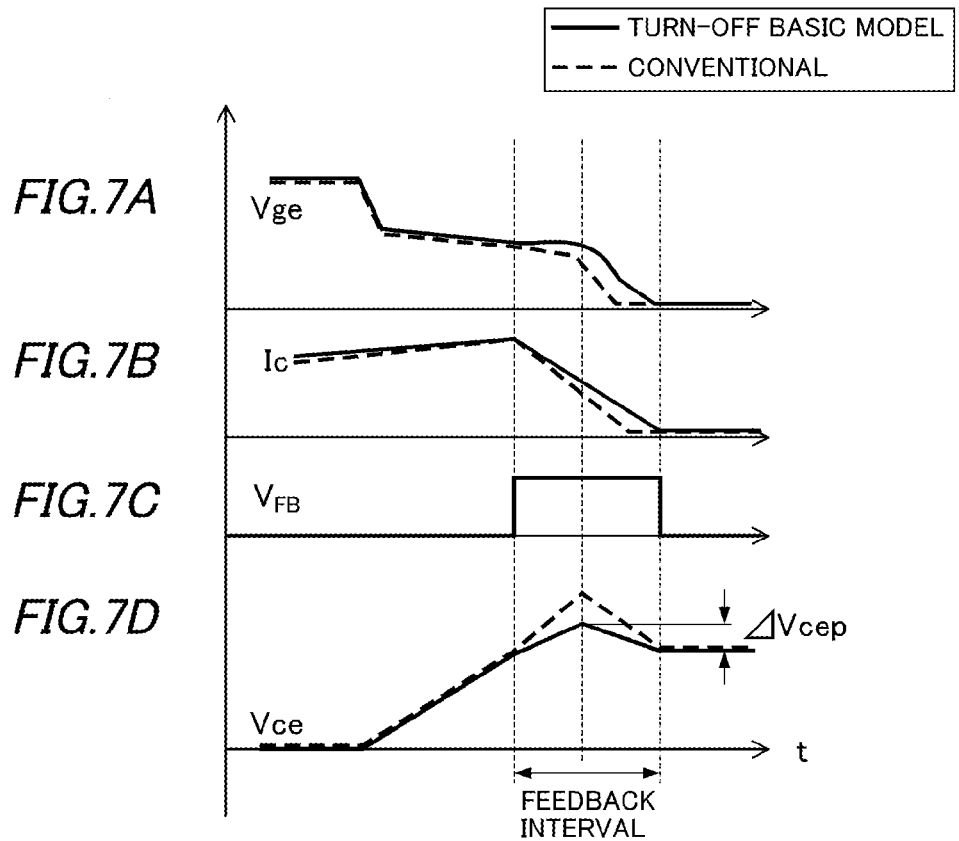
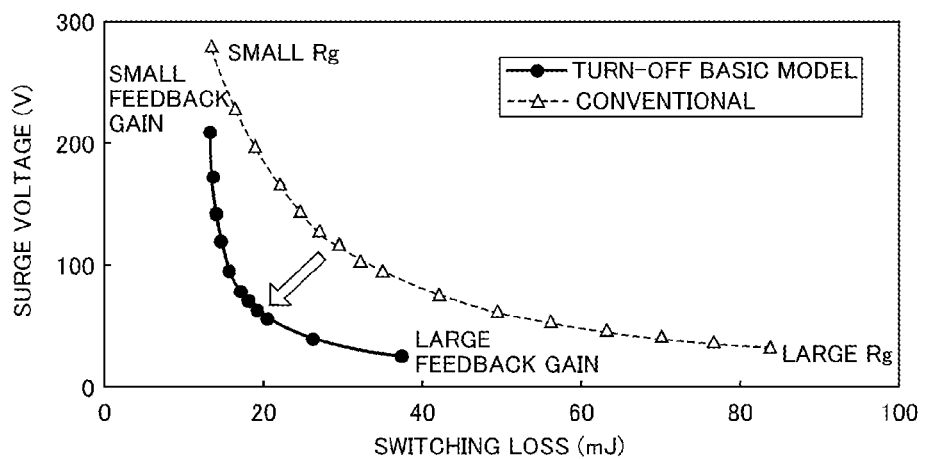

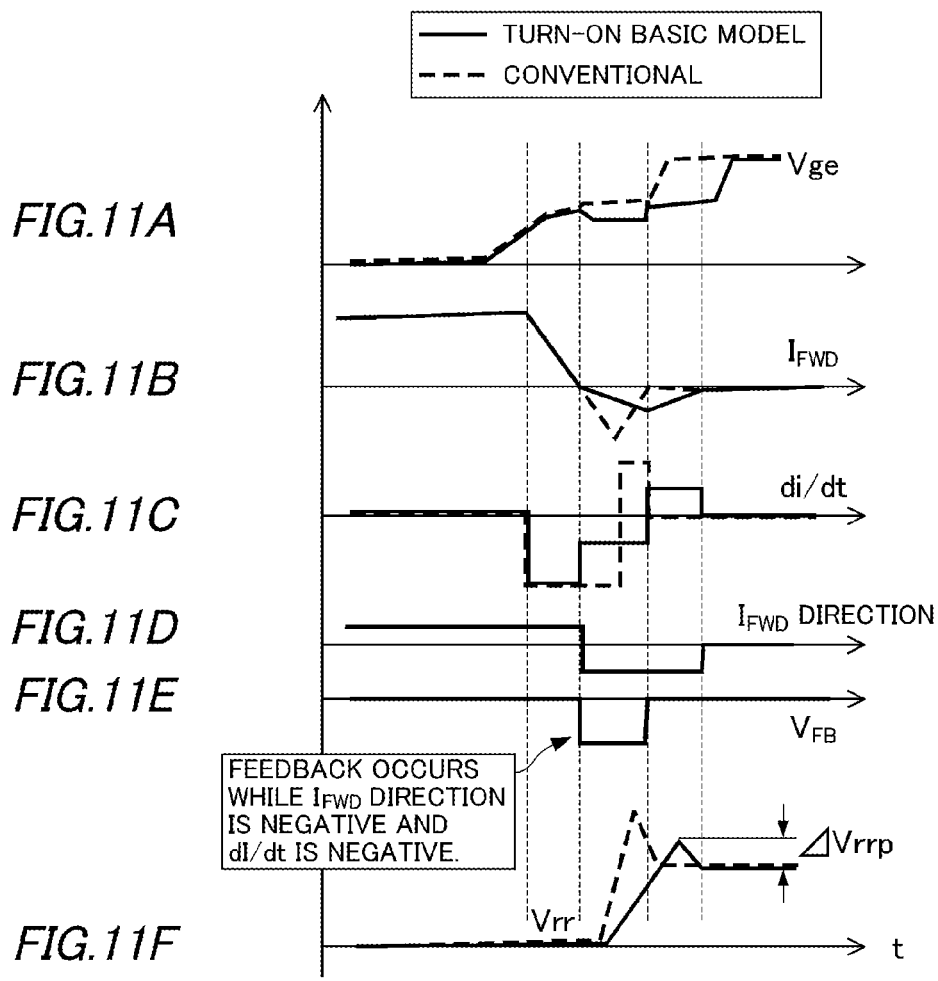
FIG. 11A — Vge
FIG. 11B — I_FWD
FIG. 11C — di/dt
FIG. 11D — I_FWD DIRECTION
FIG. 11E — V_FB
FEEDBACK OCCURS WHILE I_FWD DIRECTION IS NEGATIVE AND dI/dt IS NEGATIVE.
FIG. 11F — Vrr, ΔVrrp
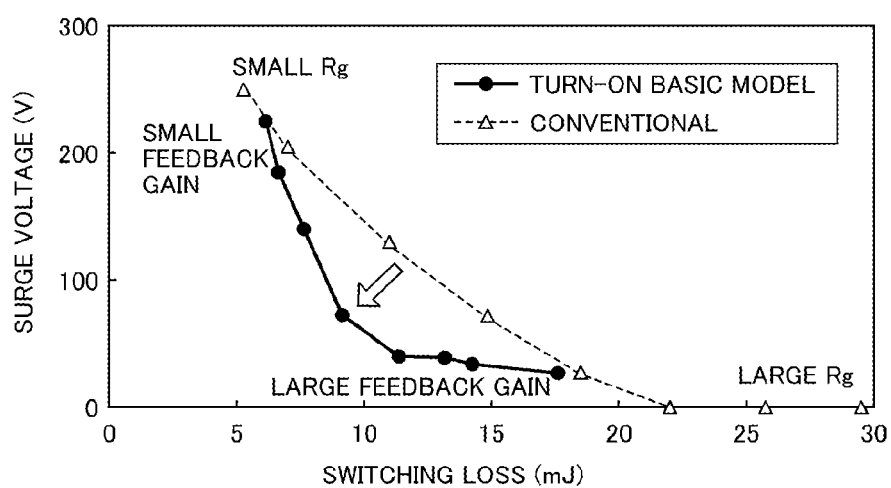
FIG. 12

FIG. 19
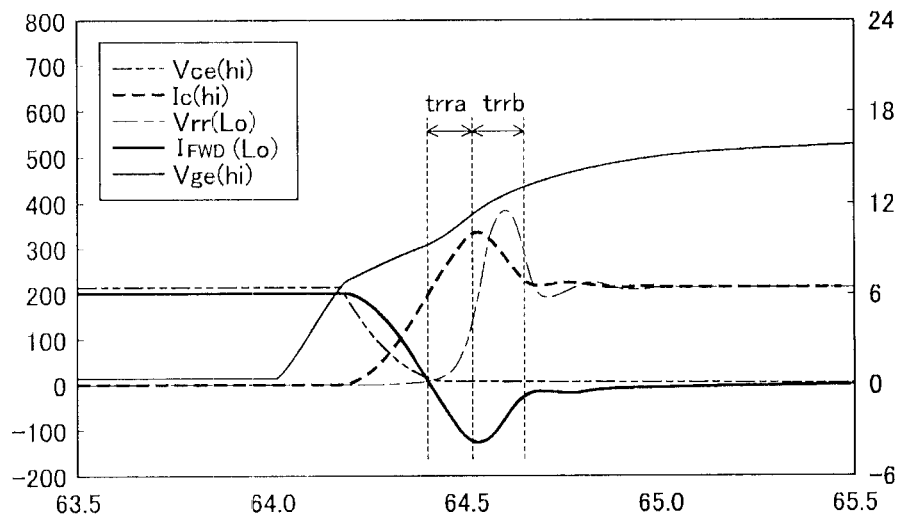
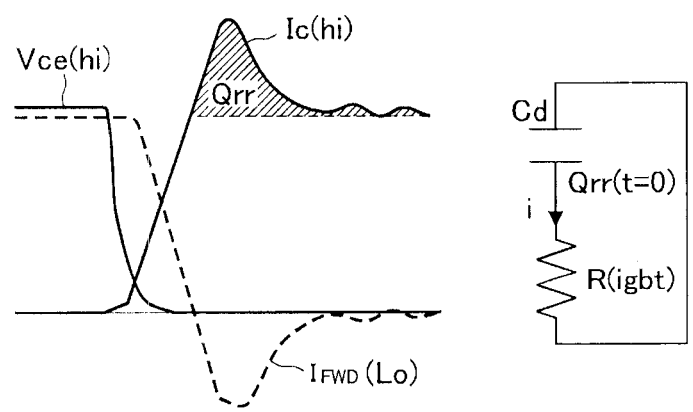
FIG. 20A      FIG. 20B

SEMICONDUCTOR DEVICE DRIVING UNIT AND METHOD

BACKGROUND OF THE INVENTION

1. Field of the Invention

The present invention relates to a unit and a method for driving a semiconductor device having a switching function. More specifically, the invention relates to a semiconductor device driving unit and method which can reduce a surge voltage while suppressing increase of a switching loss when the semiconductor device is switched.

2. Related Art

Conventionally, electric vehicles generally employ a synchronous motor which is driven by three-phase AC voltages. Therefore, electric vehicles incorporate an inverter which drives the synchronous motor by converting a DC output voltage of a battery (DC power source) into three-phase AC voltages. An inverter that is incorporated in an electric vehicle is expressly called an electric vehicle inverter.

Many electric vehicle inverters employ PWM (pulse width modulation) control and employ an IGBT (insulated gate bipolar transistor) as a power semiconductor device for realizing the PWM control (refer to Patent documents 1-3).
[Patent document 1] JP-A-2007-306166
[Patent document 2] JP-A-2008-078816
[Patent document 3] US 2010/0008113

IGBTs are self-turn-off semiconductor devices which are driven by a gate-emitter voltage Vge and can be turned on and off by a gate input signal.

The term "turn-off switching" means switching from a collector-emitter conductive state to a collector-emitter cutoff state in an IGBT. The term. "turn-on switching" means switching from a collector-emitter cutoff state to a collector-emitter conductive state in an IGBT.

In electric vehicle inverters, an FWD (free wheel diode) is paired with such an IGBT. That is, the FWD is a bypass diode for the IGBT and is connected to the IGBT in parallel in the opposite direction to the input/output direction of the IGBT.

Electric vehicle inverters are equipped with a circuit (hereinafter referred to as a semiconductor device drive circuit) for driving an IGBT. The semiconductor device drive circuit controls turn-on and turn-off of the IGBT by varying the gate-emitter voltage Vge of the IGBT.

However, a surge voltage occurs in a transient period of switching such as turn-on or turn-off of the IGBT. The surge voltage will be outlined below.

A circuit (bus) to which an IGBT is connected has a stray inductance, which gives inertia to a current, that is, acts so as to obstruct variation of the current. Therefore, when a current is going to decrease rapidly, an electromotive force is induced across the stray inductance in such a direction as to obstruct decrease of the current. That is, in electric vehicle inverters, the electromotive force is induced in such a direction as to be added to the battery power source voltage. A voltage that is generated on the basis of an electromotive force generated in this manner is called a surge voltage.

In electric vehicle inverters, plural units (e.g., three units) of IGBTs (each unit consists of two series-connected IGBTs) are parallel-connected to a three-phase load of a synchronous motor. In each unit of IGBTs, when one IGBT is turned on, the other IGBT is turned off. Therefore, in a switching transient period of one unit, the collector current of one IGBT decreases rapidly, whereby a large surge voltage is induced and superimposed on the power source voltage. A resulting voltage is applied between the collector and the emitter of the IGBT.

IGBTs are required to have such a device breakdown voltage as to withstand such a surge voltage. Therefore, naturally, as the surge voltage becomes higher, the required breakdown voltage increases and IGBTs become larger. Industrial inverters used in plants etc. can employ large IGBTs because sufficient installation spaces exist in factories. However, in the case of electric vehicle inverters, it is difficult secure a wide installation space in an electric vehicle and hence it is very difficult to employ large IGBTs.

As such, IGBTs to be incorporated in electric vehicle inverters are required to be small in size. IGBTs can be miniaturized by reducing the device breakdown voltage, which is realized by reducing the surge voltage.

Since as described above the surge voltage is generated by a rapid current decrease, the surge voltage can be reduced by decreasing the rate of a current decrease. That is, the surge voltage can be reduced by lowering the switching speed of the IGBT, that is, shortening the current/voltage rise time and fall time of switching of the IGBT.

However, lowering the switching speed to reduce the surge voltage results in increase in the loss (hereinafter referred to as a switching loss) of the IGBT and the FWD in a switching transient period.

On the other hand, as described above, the surge voltage is increased if the switching speed is increased to lower the switching loss.

As described above, a tradeoff relationship exists between the surge voltage and the switching loss. This relationship will be hereinafter referred to as a "tradeoff characteristic of the surge voltage and the switching loss."

Thus, in electric vehicle inverters, it is now demanded to improve the tradeoff characteristic of the surge voltage and the switching loss, in other words, to reduce the surge voltage while suppressing increase of the switching loss at the time of switching of IGBTs.

Although patent documents 1-3 disclose several techniques for satisfying this demand, it cannot be said that any of these techniques are satisfactory. A new technique capable of fully satisfying the demand is now desired.

Although the above description has been directed to electric vehicle inverters, electric vehicle inverters are not the only devices that are required to be miniaturized; various devices using semiconductor devices having a switching function are required to be miniaturized. Therefore, a new technique capable of fully satisfying the above demand is required to be not only applicable to IGBTs for electric vehicle inverters but also broadly applicable to general semiconductor devices having a switching function.

SUMMARY OF THE INVENTION

One or more embodiments of the invention provide a unit and a method for driving a semiconductor device having a switching function which can reduce a surge voltage while suppressing increase of a switching loss when the semiconductor device is switched.

In accordance with one or more embodiments of the invention, a semiconductor device driving unit 13 or 13U which supplies, to establish electrical continuity or disconnection in a bus, a drive signal to a gate of a first semiconductor device 11U of a series connection of the first semiconductor device 11U and a second semiconductor device 11D each of which has such a switching function as to be turned on or off according to a voltage of a drive signal applied to the gate, a collector and an emitter of each of which are inserted in the bus, and each of which is connected to a free wheeling diode 12U or 12D in parallel, may include a feedback unit 23 for generating a feedback voltage according to a temporal variation of a collector current of the first semiconductor device 11U when the first semiconductor device 11U is turned off, generating a feedback voltage according to a commutation current flowing through the free wheeling diode 12D connected to the second semiconductor device 11D when the first semiconductor device 11U is turned on, and applying the generated feedback voltage to the gate of the first semiconductor device 11U as part of the voltage of the drive signal.

Other aspects and advantages of the invention will be apparent from the following description and the appended claims.

BRIEF DESCRIPTION OF THE DRAWINGS

FIGS. 4A-4D are a timing chart showing how gate driving is performed when an IGBT is turned on in a case that the di/dt self-feedback operation is used.

FIGS. 7A-7D are a timing chart showing how the electronic circuit of FIGS. 5 and 6 (turn-off basic model) and a conventional electronic circuit operate at the time of turn-off.

FIG. 8 shows example relationships between the surge voltage and the switching loss that occur at the time of turn-off in each of the electronic circuit of FIGS. 5 and 6 (turn-off basic model) and a conventional electronic circuit.

FIG. 9 shows a general configuration of a turn-on basic model of the electronic circuit of FIG. 1 which corresponds to a case that the di/dt self-feedback operation is used at the time of turn-on.

FIGS. 11A-11F are a timing chart showing how the electronic circuit of FIGS. 5 and 6 (turn-on basic model) and a conventional electronic circuit operate at the time of turn-on.

FIG. 12 shows example relationships between the surge voltage and the switching loss that occur at the time of turn-on in each of the electronic circuit of FIGS. 9 and 10 (turn-on basic model) and the conventional electronic circuit.

FIGS. 15A-15C are timing charts comparing operations of the conventional electronic circuit and the electronic circuit of FIG. 13 at the time of turn-on.

FIG. 19 is a timing chart illustrating a method which allow each of upper and lower electronic circuits (each being the electronic circuit of FIG. 18A) to be complete in functionality in an inverter in which the upper and lower electronic circuits are connected to each other in series.

FIG. 20A illustrates a reverse recovery current that flows when excess carriers stored in the base layer of a commutation-side FWD are released in a reverse recovery interval shown in FIG. 19; FIG. 20B shows an equivalent circuit through which the reverse recovery current flows.

DETAILED DESCRIPTION OF EXEMPLARY EMBODIMENTS

Embodiments of the present invention will be hereinafter described with reference to the drawings.

Figure 1:
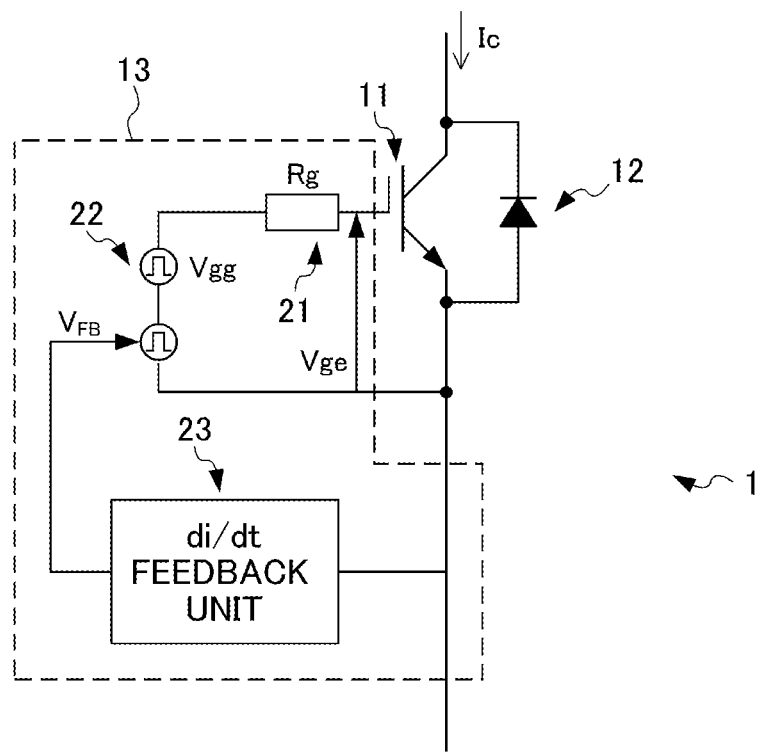
FIG. 1 shows a general configuration of an electronic circuit according to an embodiment which includes a semiconductor device drive circuit in which a di/dt self-feedback operation is used.

FIG. 1 shows a general configuration of an electronic circuit 1 including a semiconductor device drive circuit 13 according to an embodiment.

For example, the electronic circuit 1 can be used as part of a power module of an electric vehicle inverter. The electronic circuit 1 is equipped with an IGBT 11, an FWD 12, and the semiconductor device drive circuit 13.

The IGBT 11 and the FWD 12 are connected to each other in parallel in such a manner that their input/output directions are opposite to each other.

The IGBT 11 has a switching function of causing connection or disconnection of a bus such as an inverter power line, and is turned on or off according to the magnitude of the voltage of a drive signal supplied to its gate, that is, the magnitude of its gate-emitter voltage Vge.

That is, the semiconductor device drive circuit 13 controls turn-on and turn-off of the IGBT 11 by varying its gate-emitter voltage Vge.

The semiconductor device drive circuit 13 is equipped with a gate resistor 21, a voltage source 22, and a di/dt feedback unit 23.

The voltage source 22 outputs a gate voltage Vgg. One terminal of the voltage source 22 is connected to the emitter of the IGBT 11 and the other terminal is connected to the gate of the IGBT 11 via the gate resistor 21.

That is, one end of the gate resistor 21 is connected to the voltage source 22 and the other end is connected to the gate of the IGBT 11. The gate resistor 21 has functions of suppressing vibration of the gate-emitter voltage Vge of the IGBT 11 which occurs in a turn-on or turn-off transient period and adjusting the switching speed etc. of the IGBT 11. The effectiveness of these functions depends on the resistance Rg of the gate resistor 21.

When the gate voltage Vgg is made high by the voltage source 22, the gate-emitter voltage Vge of the IGBT 11 also becomes high and the IGBT 11 is turned on. When the gate voltage Vgg is made low by the voltage source 22, the gate-emitter voltage Vge of the IGBT 11 also becomes low and the IGBT 11 is turned off.

The di/dt feedback unit 23 generates a feedback voltage $V_{FB}$ on the basis of a temporal variation of a current flowing through the bus to which the IGBT 11 is connected, and causes it to serve as part of the gate-emitter voltage Vge of the IGBT 11, that is, part of the voltage of a drive signal.

To clarify that the feedback voltage $V_{FB}$ serves as part of the voltage of a drive signal, a symbol representing an external control power source (given no reference symbol) is shown in FIG. 1 as a destination of the arrow indicating the feedback voltage $V_{FB}$. However, in the embodiment, as described later, it suffices that the feedback voltage $V_{FB}$ serve as part of the voltage of a drive signal; it is not always necessary that an external control power source be provided as a device in the semiconductor device drive circuit 13.

More specifically, the di/dt feedback unit 23 generates a feedback voltage $V_{FB}$ on the basis of a temporal variation of a collector current Ic of the IGBT 11 which is a main current of the electronic circuit 1, that is, a time derivative dIc/dt, and causes it to serve as part of the gate-emitter voltage Vge of the IGBT 11.

Such an operation of the di/dt feedback unit 23 is an operation to which the invention is applied, and will expressly be referred to below as a "di/dt self-feedback operation" so that it can be discriminated from a conventional operation.

The di/dt self-feedback operation will be described below in more detail.

Equations (1)-(11) are equations for description of the principle of the di/dt self-feedback operation.

$$I_{ce\_sat} = gm \cdot (V_{ge} - V_{Th}) \quad (1)$$

In Equation (1), Ice_sat is the collector-emitter current (equivalent to the collector current Ic) of the ICBT 11, gm is the transconductance of the IGBT 11, Vge is the gate-emitter voltage Vge of the IGBT 11, and $V_{Th}$ is the threshold voltage of the IGBT 11.

Equation (2) is obtained from Equation (1):

$$\frac{dI_{ce}}{dt} = gm \cdot \frac{dV_{ge}}{dt} + \frac{dgm}{dt} \cdot V_{ge} \quad (2)$$

As seen from Equation (2), the temporal variation of the collector-emitter current Ice of the ICBT 11 depends on the temporal variations of the gate-emitter voltage Vge of the IGBT 11 and the transconductance gm of the IGBT 11.

The transconductance gm of the IGBT 11 is given by Equation (3):

$$gm = \left.\frac{\partial I_{ce\_sat}}{\partial V_{ge}}\right|_{V_{DS}=const} = \frac{1}{1-\alpha_{PNP}} \cdot \frac{\mu_{ns} \cdot C_{ox}}{L_{ch}} \cdot (V_{ge} - V_{Th}) \quad (3)$$

In Equation (3), $\alpha_{PNP}$ is the emitter injection efficiency and $\mu_{ns}$ is the electron average mobility in the channel.

Equation (4) is obtained from Equation (3):

$$\frac{dgm}{dt} = \frac{1}{1-\alpha_{PNP}} \cdot \frac{\mu_{ns} \cdot C_{ox}}{L_{ch}} \cdot \frac{dV_{ge}}{dt} \quad (4)$$

Now, K is defined as follows (Equation (5)):

$$K = \frac{1}{1-\alpha_{PNP}} \cdot \frac{\mu_{ns} \cdot C_{ox}}{L_{ch}} \quad (5)$$

Equation (6) is obtained from Equations (2)-(5):

$$\frac{dI_{ce}}{dt} = K \cdot (V_{ge} - V_{Th}) \cdot \frac{dV_{ge}}{dt} + K \cdot \frac{dV_{ge}}{dt} \cdot (V_{ge} - V_{Th}) \quad (6)$$
$$= 2 \cdot K \cdot (V_{ge} - V_{Th}) \cdot \frac{dV_{ge}}{dt} = 2 \cdot gm \cdot \frac{dV_{ge}}{dt}$$

The gate-emitter voltage Vge of the IGBT 11 is given by Equation (7):

$$V_{ge} = V_{bias} + V_{FB} - R_g \cdot i_g \quad (7)$$

In Equation (7), $V_{FB}$ is the feedback voltage. If it is assumed for the sake of simplification that the gate resistance Rg is equal to 0, Equation (8) is obtained from Equation (7):

$$\frac{dV_{ge}}{dt} = \frac{dV_{bias}}{dt}(=0) + \frac{dV_{FB}}{dt} = \frac{dV_{FB}}{dt} \quad (8)$$

Equation (9) is obtained from Equation (8):

$$\frac{dI_{ce}}{dt} = 2 \cdot gm \cdot \frac{dV_{FB}}{dt} \quad (9)$$

It is seen from Equation (9) that the gain (absolute value) is proportional to 2 gm and the temporal variation of the collector-emitter current Ice (equivalent to the collector current Ic) of the ICBT 11, that is, the time derivative dIc/dt, is proportional to the temporal variation of the feedback voltage $V_{FB}$.

Equations (10) and (11) are obtained when a voltage that is proportional to the temporal variation of the collector-emitter current Ice (equivalent to the collector current Ic) of the ICBT 11, that is, the time derivative dIc/dt, is fed back as the feedback voltage $V_{FB}$:

$$V_{FB} = A_{gain} \cdot \frac{dI_{ce}}{dt} \quad (10)$$

$$\frac{dI_{ce}}{dt} = 2 \cdot gm \cdot A_{gain} \cdot \frac{d^2 I_{ce}}{dt^2} \quad (11)$$

It is seen from Equation (11) that the temporal variation of the collector-emitter current Ice (equivalent to the collector current Ic) of the ICBT 11, that is, the time derivative dIc/dt, is proportional to the second derivative of the collector-emitter current Ice itself.

As described above, in the di/dt self-feedback operation, a voltage that is proportional to the temporal variation of the collector-emitter current Ice (equivalent to the collector current Ic) of the ICBT 11, that is, the time derivative dIc/dt, is made the feedback voltage $V_{FB}$ and caused to serve as part of the gate-emitter voltage Vge of the IGBT 11. In this manner, a largest gain can be obtained, that is, it becomes possible to act on dIc/dt, in a range that generation of a surge voltage of the IGBT 11 is started and the temporal variation of the collector current Ic inflects.

Figure 2:
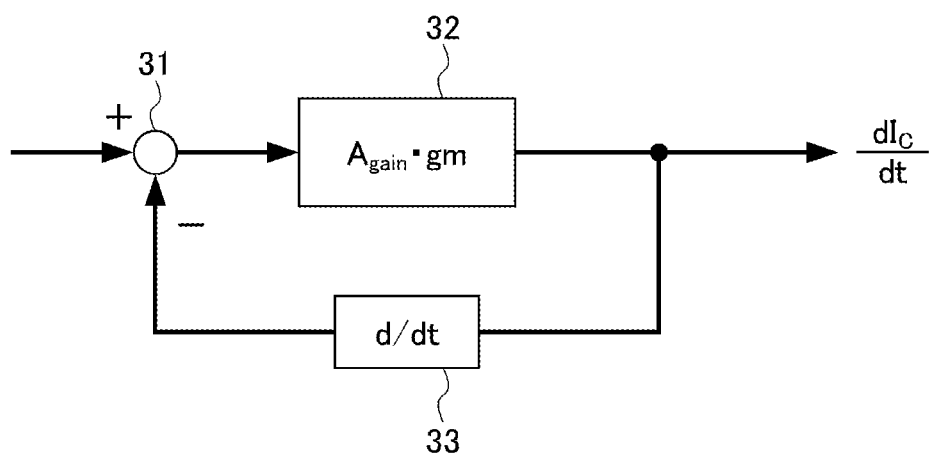
FIG. 2 shows control blocks capable of realizing the di/dt self-feedback operation.

FIG. 2 shows control blocks that are based on the above-derived Equations (10) and (11), that is, control blocks capable of realizing the di/dt self-feedback operation.

As shown in FIG. 2, the di/dt self-feedback operation is realized by a feedback control system which is composed of an addition block B1, a gain block B2, and a time differentiation block B3.

The addition block B1 corresponds to the gate of the IGBT 11. More specifically, in the addition block B1, the positive (+) input corresponds to the input from the voltage source 22 to the gate of the IGBT 11 and the negative (−) input corresponds to the input from the di/dt feedback unit 23 to the gate of the IGBT 11.

The input from the di/dt feedback unit 23 to the gate of the IGBT 11 is voltage information which is obtained by time-differentiating, with the time differentiation block B3, a time derivative dIc/dt which is a temporal variation of the collector current Ic of the IGBT 11.

In this manner, the di/dt self-feedback operation is realized in such a manner that voltage information which is obtained by time-differentiating a time derivative dIc/dt of the collector current Ic of the IGBT 11 is fed back to the gate of the IGBT 11 as a feedback voltage $V_{FB}$.

The polarity of the feedback voltage $V_{FB}$ is such as to lower the gate-emitter voltage Vge of the IGBT 11 when the IGBT 11 is turned on and to raise the gate-emitter voltage Vge of the IGBT 11 when the IGBT 11 is turned off. A surge voltage from the IGBT 11 is suppressed automatically because the gate-emitter voltage Vge of the IGBT 11 increases or decreases automatically according to the degree of current variation so that the time derivative of a temporal variation of the current flowing through the gate of the IGBT 11 (the second time derivative of the current) becomes zero. Although the time variation of the collector current Ic of the IGBT 11, that is, the time derivative dIc/dt, varies every moment, it is fed back to the gate, the gate-emitter voltage Vge of the IGBT 11 is always adjusted to an optimum value.

The feedback gain is determined by the gain of the gain block B2, that is, the product of a control gain $A_{gain}$ that is set in the feedback loop control system in advance and the transconductance gm of the IGBT 11.

In general, the transconductance gm of the IGBT 11 has a large gain. Therefore, even if the control gain $A_{gain}$ is relatively small, the effect of influencing the current variation and improving the tradeoff characteristic of the surge voltage and the switching loss to an ideal one is obtained. This effect automatically optimizes a variation among switching speeds of individual IGBTs 11.

That is, whereas the conventional technique of Patent document 1 necessitates adjusting control parameters of an IGBT to worst values, the use of the di/dt self-feedback operation allows each IGBT 11 to be driven in an optimum state automatically all the time without causing differences between individual IGBTs 11.

Thus, the tradeoff characteristic of the surge voltage and the switching loss can be improved by using the di/dt self-feedback operation.

The tradeoff characteristic of the surge voltage and the switching loss will be described below in detail by describing an approach (hereinafter referred to as a conventional approach) that has been employed commonly in the art with reference to FIGS. 3A and 3B.

Figures 3A, 3B:
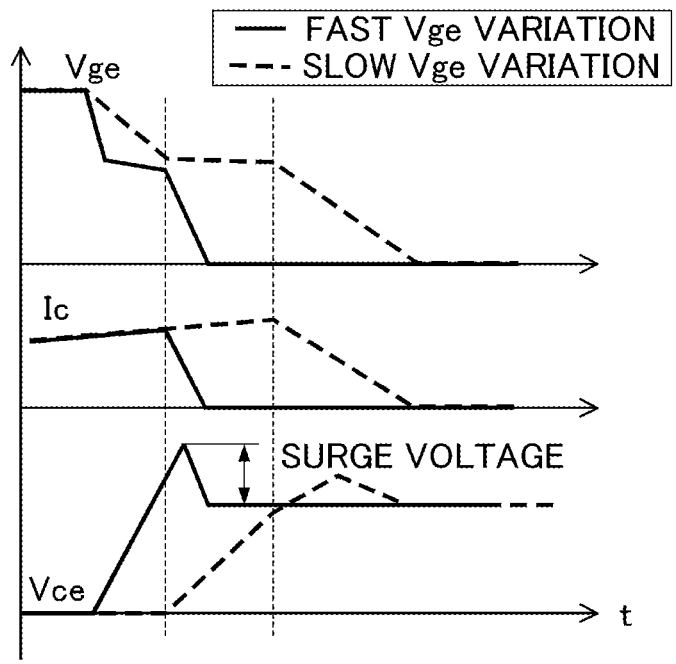
FIGS. 3A and 3B illustrate a conventional approach in which a clear tradeoff relationship exists between a surge voltage and a switching loss.

FIGS. 3A and 3B illustrate the conventional approach in which a clear tradeoff relationship exists between the surge voltage and the switching loss.

FIG. 3A is a timing chart showing how gate driving is performed when an IGBT is turned off in a case that the conventional approach is employed. More specifically, FIG. 3A is a timing chart including waveform diagrams of the gate-emitter voltage Vge, the collector current Ic, and the collector-emitter voltage Vice (shown downward in this order).

In each of the waveform diagrams of FIG. 3A, the solid line is a waveform of a case that the degree of variation of the gate-emitter voltage Vge is relatively large and the broken line is a waveform of a case that the degree of variation of the gate-emitter voltage Vge is relatively small.

FIG. 3B shows a corresponding relationship between the degree (high/low) of variation of the gate-emitter voltage Vge and the surge voltage and the switching loss.

As shown in FIG. 3A, the manners of variation of the collector current Ic and the collector-emitter voltage Vce depend on the degree (high/low) of variation of the gate-emitter voltage Vge.

In the conventional approach, the manners of variation of the collector current Ic and the collector-emitter voltage Vce are determined by uniquely determining the degree of variation of the gate-emitter voltage Vge by means of the resistance Rg of the gate resistor (corresponds to the gate resistor 21 shown in FIG. 1), whereby a surge voltage and a switching characteristic are determined.

More specifically, if the degree of variation of the gate-emitter voltage Vge in a transient period is set high, the variation rate of the collector current Ic is increased (see FIGS. 3A and 3B) and hence the surge voltage is increased. On the other hand, since the rise and the fall of each of the collector current Ic and the collector-emitter voltage Vce become steeper, the switching loss is reduced.

Conversely, if the degree of variation of the gate-emitter voltage Vge in a transient period is set low, the variation rate of the collector current Ic is decreased (see FIGS. 3A and 3B) and hence the surge voltage is decreased. On the other hand, since the rise and the fall of each of the collector current Ic and the collector-emitter voltage Vice become gentler, the switching loss is increased.

The conventional approach allows selection of only one of the state that the degree of variation of the gate-emitter voltage Vge in a transient period is set high and the state that the degree of variation of the gate-emitter voltage Vge in a transient period is set low. Therefore, although one of the surge voltage and the switching loss can be reduced, the other is increased (tradeoff relationship).

That is, when the conventional approach is employed, only one of the surge voltage characteristic and the switching loss characteristic can be improved because they have a tradeoff relationship. This relationship is called the tradeoff characteristic of the surge voltage and the switching loss.

The tradeoff characteristic of the surge voltage and the switching loss can be improved by using the di/dt self-feedback operation.

FIGS. 4A-4D are a timing chart showing how gate driving is performed when the IGBT 11 is turned off in a case that the di/dt self-feedback operation is used.

FIG. 4A includes waveforms of a conventional gate-emitter voltage Vge (the di/dt self-feedback operation is not used) and a feedback voltage $V_{FB}$ generated by the di/dt self-feedback operation. That is, in FIG. 4A, the solid line is a waveform of the conventional gate-emitter voltage Vge and the broken line is a waveform of the feedback voltage $V_{FB}$.

FIG. 4B is a waveform diagram of the gate-emitter voltage Vge in a case that the di/dt self-feedback operation is used. It is easily understood by comparing FIGS. 4A and 4B that the gate-emitter voltage Vge in a case that the di/dt self-feedback operation is used is the conventional gate-emitter voltage Vge plus the feedback voltage $V_{FB}$. This gate-emitter voltage Vge will be referred to below as a "gate-emitter voltage Vge of current self-feedback."

FIG. 4C is a waveform diagram of the collector current Ic. FIG. 4D is a waveform diagram of the collector-emitter voltage Vce.

When the collector current Ic varies at a low rate, its time derivative dIc/dt is close to zero. The feedback voltage $V_{FB}$ also becomes close to zero and the gate-emitter voltage Vge of current self-feedback is approximately equal to the conventional gate-emitter voltage Vge. Therefore, the degree of variation of gate-emitter voltage Vge of current self-feedback is approximately as high as that of the conventional gate-emitter voltage Vge.

As a result, the rise of the collector-emitter voltage Vce is approximately as steep as that of the conventional collector-emitter voltage Vce, as a result of which the switching loss is small.

Then, the collector current Ic decreases and its time derivative becomes larger than a prescribed value. As a result, the feedback voltage $V_{FB}$ becomes larger than a prescribed value and is added to the conventional gate-emitter voltage Vge to produce the gate-emitter voltage Vge of current self-feedback. Thus, the degree of variation of the gate-emitter voltage Vge of current self-feedback is lower than that of the conventional gate-emitter voltage Vge.

Since the degree of variation of the collector current Ic becomes lower than in the conventional case, as shown in FIG. 4D the surge voltage is made smaller than in the conventional case (see FIG. 3A).

As described above, when the di/dt self-feedback operation is used, the degree of variation of the gate-emitter voltage Vge of current self-feedback is automatically adjusted in each interval, which realizes an effect that the surge voltage can be reduced while increase of the switching loss is suppressed. This effect means an effect capable of improving the tradeoff characteristic of the surge voltage and the switching loss.

Figure 5:
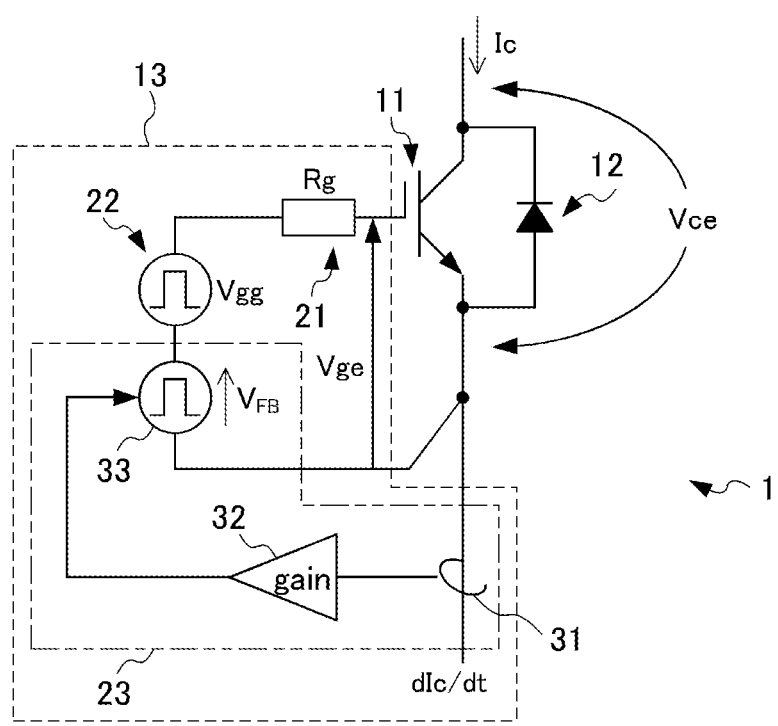
FIG. 5 shows a general configuration of a turn-off basic model of the electronic circuit of FIG. 1 which corresponds to a case that the di/dt self-feedback operation is used at the time of turn-off.

FIG. 5 shows a general configuration of the electronic circuit 1 including the semiconductor device drive circuit 13 according to the embodiment which corresponds to a case that the above-described di/dt self-feedback operation is used at the time of turn-off.

The configuration of the electronic circuit 1 shown in FIG. 5 is the same as that shown in FIG. 1 except for the di/dt feedback unit 23. That is, FIG. 5 is different from FIG. 1 in that an example configuration of the di/dt feedback unit 23 is shown in FIG. 5. Therefore, the difference from FIG. 1, that is, the example configuration of the di/dt feedback unit 23, will be described below.

The configuration of the electronic circuit 1 shown in FIG. 5 which corresponds to a case that the di/dt self-feedback operation is used at the time of turn-off is a basic configuration, based on which various implementation forms can be conceived. Therefore, the configuration of the electronic circuit 1 shown in FIG. 5 will be referred to below as a "turn-off basic model."

The di/dt feedback unit 23 is composed of a di/dt detecting unit 31, a gain unit 32, and a voltage source 33. The di/dt detecting unit 31 detects a temporal variation of the collector current Ic of the IGBT 11, that is, a time derivative dIc/dt. The gain unit 32 multiples the time derivative dIc/dt detected by the di/dt detecting unit 31 by a prescribed gain. The voltage source 33 outputs, as a feedback voltage $V_{FB}$, a voltage whose magnitude corresponds to the time derivative dIc/dt multiplied by the prescribed gain by the gain unit 32.

Figure 6:
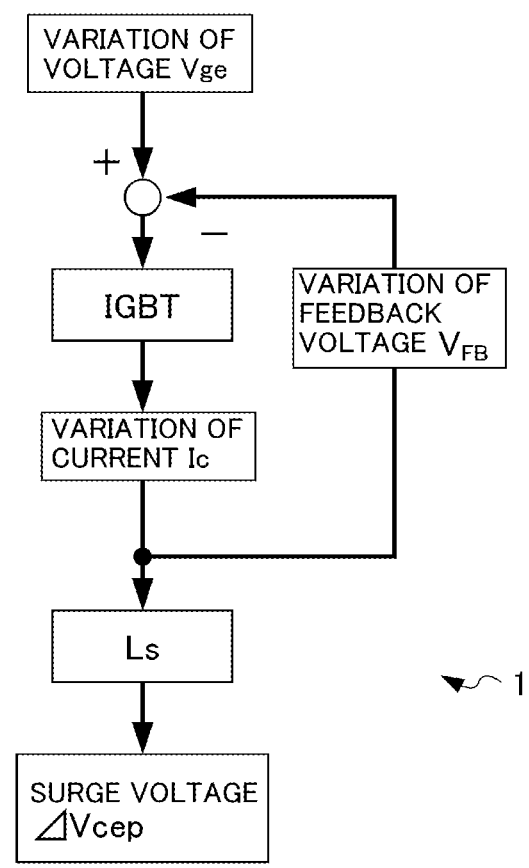
FIG. 6 is a flowchart of the turn-off basic model of the electronic circuit of FIG. 5.

FIG. 6 is a flowchart of the turn-off basic model of the electronic circuit 1 of FIG. 5.

In FIG. 6, a unidirectional flow (downward flow) that a variation of the gate-emitter voltage Vge caused by turn-off of the IGBT 11 causes a variation of the collector current Ic through the IGBT 11, which in turn causes a surge voltage ΔVcep through a stray inductance Ls, is a conventional flow and hence will be referred to below as a "conventional flow."

The flow of the turn-off basic model is different from the conventional flow in that a variation of the feedback voltage $V_{FB}$ which corresponds to the variation of the collector current Ic is fed back negatively and added to the variation of the gate-emitter voltage Vge.

FIGS. 7A-7D are a timing chart showing how the electronic circuit 1 of FIGS. 5 and 6 (turn-off basic model) and an electronic circuit that operates according to the conventional flow (hereinafter referred to as a "conventional electronic circuit") operate at the time of turn-off.

FIG. 7A is a waveform diagram of the gate-emitter voltage Vge. FIG. 7B is a waveform diagram of the collector current Ic. FIG. 7C is a waveform diagram of the feedback voltage $V_{FB}$. FIG. 7D is a waveform diagram of the collector-emitter voltage Vice.

In each of FIGS. 7A, 7B, and 7D, the solid line is a waveform corresponding to the electronic circuit 1 (turn-off basic model) and the broken line is a waveform of the conventional electronic circuit. Since the conventional electronic circuit does not generate a feedback voltage $V_{FB}$, naturally the feedback voltage $V_{FB}$ shown in FIG. 7C is of the electronic circuit 1 (turn-off basic model).

Since the detailed principle has already been described above with reference to FIGS. 4A-4D, only a brief description will be made below.

In the electronic circuit 1 (turn-off basic model), as shown in FIG. 7C, no feedback voltage $V_{FB}$ is generated in an interval to the start of decrease of the collector current Ic, that is, in an interval before a "feedback interval" (see FIG. 7B).

Therefore, as shown in FIG. 7A, the gate-emitter voltage Vge (solid line) of the electronic circuit 1 (turn-off basic model) varies approximately in the same manner as the gate-emitter voltage Vge (broken line) of the conventional electronic circuit.

As a result, as shown in FIG. 7D, the collector-emitter voltage Vce (solid line) of the electronic circuit 1 (turn-off basic model) rises approximately as steeply as the collector-emitter voltage Vce (broken line) of the conventional electronic circuit.

Thus, the switching loss of the electronic circuit 1 (turn-off basic model) can be made approximately as small as that of the conventional electronic circuit.

On the other hand, in an interval in which the collector current Ic decreases, that is, in the "feedback interval" (see FIG. 7B), as shown in FIG. 7C a feedback voltage $V_{FB}$ is generated in the electronic circuit 1 (turn-off basic model).

Therefore, as shown in FIG. 7A, the gate-emitter voltage Vge (solid line) of the electronic circuit 1 (turn-off basic model) is equal to the gate-emitter voltage Vge (broken line) of the conventional electronic circuit added with the feedback voltage $V_{FB}$. As a result, the degree of variation of the gate-emitter voltage Vge (solid line) of the electronic circuit 1

(turn-off basic model) is lower than that of the gate-emitter voltage Vge (broken line) of the conventional electronic circuit.

As a result, as shown in FIG. 7B, the degree of variation of the collector current Ic (solid line) of the electronic circuit 1 (turn-off basic model) becomes lower than that of the collector current Ic (broken line) of the conventional electronic circuit.

Thus, the surge voltage ΔVcep (the height difference of the solid-line waveform) of the electronic circuit 1 (turn-off basic model) can be made smaller than the surge voltage ΔVcep (the height difference of the broken-line waveform) of the conventional electronic circuit.

FIG. 8 shows example relationships between the surge voltage and the switching loss that occur at the time of turn-off in each of the electronic circuit 1 (turn-off basic model) and the conventional electronic circuit. In FIG. 8, the vertical axis represents the surge voltage ΔVcep and the horizontal axis represents the switching loss. The solid line is a curve connecting plotting points of measurement values obtained by varying the feedback gain in the electronic circuit 1 (turn-off basic model). The broken line is a curve connecting plotting points of measurement values obtained by varying the gate resistance Rg in the conventional electronic circuit.

As seen from FIG. 8, the surge voltage ΔVcep can be made much smaller than in the conventional electronic circuit without increasing the switching loss by optimizing the feedback gain of the electronic circuit 1 (turn-off basic model), for example, by employing a feedback gain corresponding to the plotting point that is pointed by the white arrow in FIG. 8.

Actual measurements revealed that the effect of reducing the surge voltage ΔVcep is enhanced as the turn-off speed of the IGBT 11 increases.

The turn-off model of the electronic circuit 1 which is directed to the case that the di/dt self-feedback operation is used at the time of turn-off has been described above.

Next, a description will be made of the electronic circuit 1 according to the embodiment which is directed to a case that the di/dt self-feedback operation is used at the time of turn-on.

Figure 9:
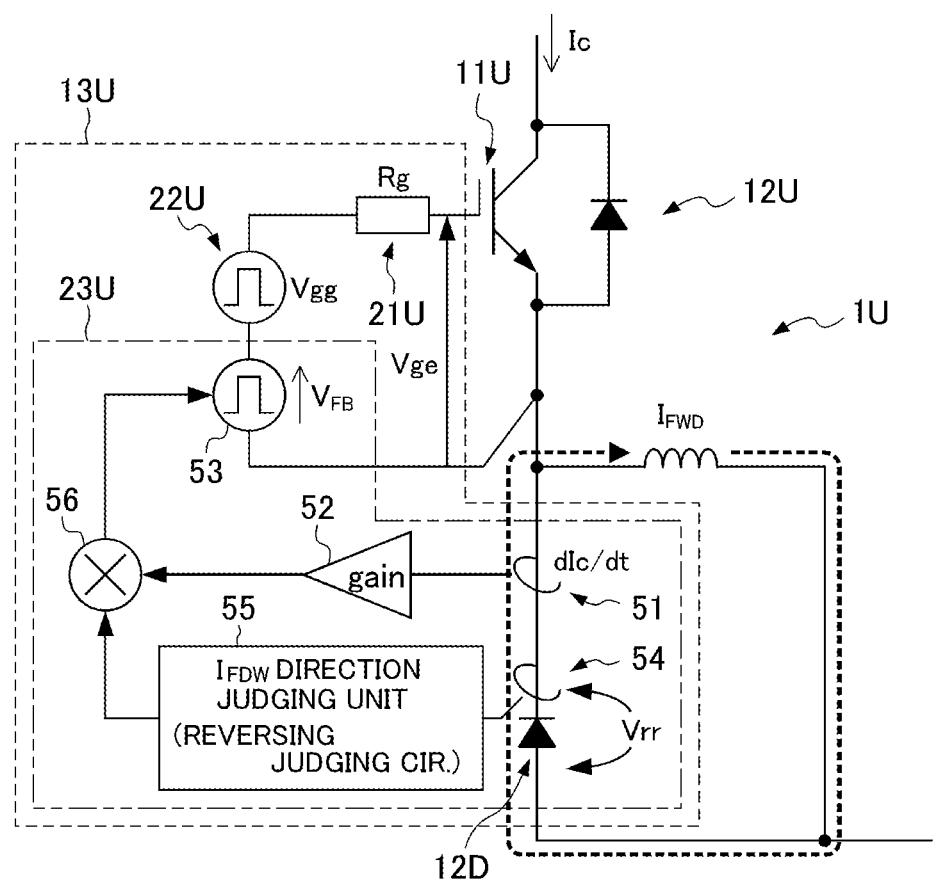

FIG. 9 shows a general configuration of the electronic circuit 1 including the semiconductor device drive circuit 13 according to the embodiment which corresponds to a case that the di/dt self-feedback operation is used at the time of turn-on.

For example, an IGBT 11U of an electronic circuit 1U shown in FIG. 9 is connected to an IGBT 11D (although not shown in FIG. 9, it is given reference symbol 11D for the sake of consistency with the manner of use of symbols in FIG. 13 (referred to later)) of another electronic circuit in series in the same direction. Although not shown in FIG. 9, the electronic circuit including the IGBT 11D is equipped with a circuit having the same configuration and functions as a semiconductor device drive circuit 13U shown in FIG. 9.

The series connection of the IGBTs 11U and 11D is incorporated in an inverter, for example, and is parallel-connected to a main circuit power source (not shown in FIG. 9; refer to a main circuit power source 101 shown in FIG. 13) and a smoothing capacitor. More specifically, the positive-pole terminal of the main circuit power source 101 is connected to the collector side of the IGBT 11U and its negative-pole terminal is connected to the emitter side of the IGBT 11D (not shown in FIG. 9; refer to FIG. 13).

The configuration of the electronic circuit 1U shown in FIG. 9 is the same as the electronic circuit 1 shown in FIG. 1 except for a di/dt feedback unit 23U (circuit components shown in FIG. 9 are given reference symbols having a suffix "U"). That is, FIG. 9 is different from FIG. 1 in that an example configuration of the di/dt feedback unit 23U is shown in FIG. 9. Therefore, t difference from FIG. 1, that is, the example configuration of the di/dt feedback unit 23U, will be described below.

The configuration of the electronic circuit 1U shown in FIG. 5 which corresponds to a case that the di/dt self-feedback operation is used at the time of turn-on is a basic configuration, based on which various implementation forms can be conceived. Therefore, the configuration of the electronic circuit 1U shown in FIG. 9 will be referred to below as a "turn-on basic model."

The di/dt feedback unit 23U is composed of a di/dt detecting unit 51, a gain unit 52, and a voltage source 53, an $I_{FWD}$ detecting unit 54 ($I_{FWD}$: commutation current), an $I_{FWD}$ direction judging unit (reversing judging circuit) 55, and a multiplier 56.

The IGBTs 11U and 11D are driven by the semiconductor device drive circuit 13U of the electronic circuit 1U and the semiconductor device drive circuit of the electronic circuit not shown in FIG. 9, respectively, so that when one of the IGBTs 11U and 11D is conductive the other is cut off.

That is, when the IGBT 11U is turned on, the IGBT 11D (not shown) is turned off. At this time, the commutation current $I_{FWD}$ flows through an FWD 12D (paired with the IGBT 11D) in the direction from the cathode of the FWD 12D to a load L such as a motor (see FIG. 9). A surge voltage is generated in a voltage Vrr across the FWD 12D.

The di/dt detecting unit 51 of the electronic circuit 1U (turn-on basic model) detects a temporal variation of the commutation current $I_{FWD}$, that is, a time derivative dI/dt. The gain unit 52 multiples the time derivative dI/dt detected by the di/dt detecting unit 51 by a prescribed gain. The voltage source 53 outputs, as a feedback voltage $V_{FB}$, a voltage whose magnitude corresponds to the time derivative dI/dt multiplied by the prescribed gain by the gain unit 52.

Since a reverse recovery interval is the only interval that influences the generation of a surge voltage, the electronic circuit 1U (turn-on basic model) has a reversing judging function and a feedback voltage $V_{FB}$ is applied only during the reverse recovery interval.

In the di/dt feedback unit 23U, the $I_{FWD}$ detecting unit 54, the $I_{FWD}$ direction judging unit (reversing judging circuit) 55, and the multiplier 56 are components for realizing the reversing judging function.

The $I_{FWD}$ detecting unit 54 detects a commutation current $I_{FWD}$. The $I_{FWD}$ direction judging unit 55 judges the direction of the commutation current $I_{FWD}$. The $I_{FWD}$ direction judging unit 55 judges that the present time is in a reverse recovery interval if the direction of the commutation current $I_{FWD}$ is the direction corresponding to the reverse recovery interval, that is, the direction from the cathode of the FWD 12D to the load L such as a motor. If judging that the present time is in a reverse recovery interval, the $I_{FWD}$ direction judging unit 55 supplies a value "1" indicating the judgment result to the multiplier 56.

In contrast, in other cases, judging that the present time is not in a reverse recovery interval, the $I_{FWD}$ direction judging unit 55 supplies a value "0" indicating the judgment result to the multiplier 56.

The multiplier 56 multiplies an output signal of the gain unit 52 by the value supplied from the $I_{FWD}$ direction judging unit 55. More specifically, if the present time is in a reverse recovery interval, since the $I_{FWD}$ direction judging unit 55 supplies the multiplier 56 with the value "1" indicating the judgment result, the output signal of the gain unit 52 is output from the multiplier 56 and applied as a feedback voltage $V_{FB}$.

In contrast, if the present time is not in a reverse recovery interval, since the $I_{FWD}$ direction judging unit 55 supplies the multiplier 56 with the value "0" indicating the judgment result, the output of the multiplier 56 also becomes "0" and application of a feedback voltage $V_{FB}$ is prohibited.

Figure 10:
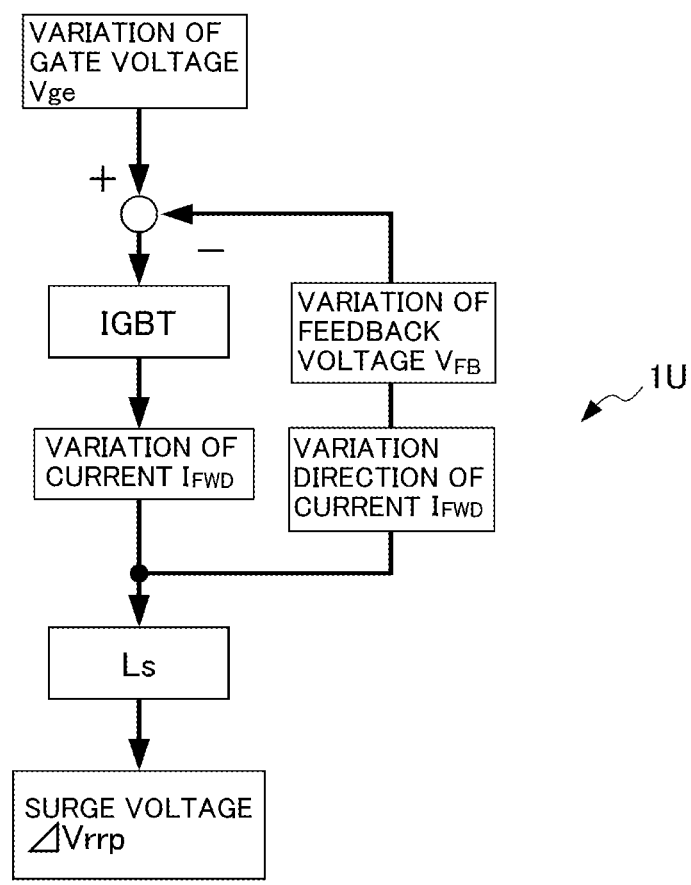
FIG. 10 is a flowchart of the turn-on basic model of the electronic circuit of FIG. 9.

FIG. 10 is a flowchart of the turn-on basic model of the electronic circuit 1U of FIG. 9.

In FIG. 10, a unidirectional flow (downward flow) that a variation of the gate-emitter voltage Vge caused by turn-on of the IGBT 11U causes, through the IGBT 11U, a variation of the commutation current $I_{FWD}$ flowing through the FWD 12D which is paired with the IGBT 11D which is series-connected to the IGBT 11U and the variation of the commutation current $I_{FWD}$ in turn causes a surge voltage ΔVcep through a stray inductance Ls, is a conventional flow and hence will be referred to below as a "conventional flow."

The flow of the turn-on basic model is different from the conventional flow in that a variation direction of the commutation current $I_{FWD}$ is judged and, if the variation direction corresponds to a reverse recovery interval, a variation of the feedback voltage $V_{FB}$ that corresponds to the variation of the commutation current $I_{FWD}$ is fed back negatively and added to the variation of the gate-emitter voltage Vge.

FIGS. 11A-11F are a timing chart showing how the electronic circuit 1U of FIGS. 9 and 10 (turn-on basic model) and an electronic circuit that operates according to the conventional flow (hereinafter referred to as a "conventional electronic circuit") operate at the time of turn-on.

FIG. 11A is a waveform diagram of the gate-emitter voltage Vge of the IGBT 11U. FIG. 11B is a waveform diagram of the commutation current $I_{FWD}$ of the FWD 12D which is paired with the IGBT 11D which is series-connected to the IGBT 11U. FIG. 11C is a waveform diagram of the time derivative of the commutation current $I_{FWD}$, that is, the time derivative dI/dt. FIG. 11D is a waveform diagram of the signal indicating the direction of the commutation current $I_{FWD}$. FIG. 11E is a waveform diagram of the feedback voltage $V_{FB}$. FIG. 11F is a waveform diagram of the voltage Vrr across the FWD 12D.

In each of FIGS. 11A-11F, the solid line is a waveform corresponding to the electronic circuit 1U (turn-on basic model) and the broken line is a waveform of the conventional electronic circuit. Since the conventional electronic circuit does not generate a feedback voltage $V_{FB}$, naturally the signal indicating the direction of the commutation current $I_{FWD}$ shown in FIG. 11D and the feedback voltage $V_{FB}$ shown in FIG. 11E are of the electronic circuit 1U (turn-on basic model).

The principle of the turn-on basic model of the electronic circuit 1U will be described briefly below with reference to FIGS. 11A-11F.

In this example, the period in which the direction of the commutation current $I_{FWD}$ is negative (see FIG. 11D) is the reverse recovery interval. Therefore, in the electronic circuit 1U (turn-on basic model), as shown in FIG. 11E, no feedback voltage $V_{FB}$ is generated in the period when the direction of the commutation current $I_{FWD}$ is positive (see FIG. 11D), When the direction of the commutation current $I_{FWD}$ is then reversed from positive to negative (see FIG. 11D), a feedback voltage $V_{FB}$ is generated as shown in FIG. 11E. The feedback voltage $V_{FB}$ continues to be generated while the time derivative of the commutation current $I_{FWD}$, that is, the time derivative dI/dt is negative (see FIG. 11C).

When the time derivative of the commutation current $I_{FWD}$, that is, the time derivative dI/dt is then reversed from negative to positive (see FIG. 11C), the feedback voltage $V_{FB}$ disappears.

As described above, a feedback voltage $V_{FB}$ is generated while the direction of the commutation current $I_{FWD}$ is negative and the time derivative of the commutation current $I_{FWD}$, that is, the time derivative dI/dt is negative. That is, a feedback voltage $V_{FB}$ is generated while the feedback gain has an optimum value and the present time is in a reverse recover time of the FWD 12D.

As a result, as shown in FIG. 11F, a surge voltage ΔVrrp (the height difference of the solid-line waveform) in the voltage Vrr across the FWD 12D of the electronic circuit 1U (turn-on basic model) can be made smaller than a surge voltage ΔVrrp (the height difference of the broken-line waveform) of the conventional electronic circuit.

FIG. 12 shows example relationships between the surge voltage and the switching loss that occur at the time of turn-on in each of the electronic circuit 1U (turn-on basic model) and the conventional electronic circuit. In FIG. 12, the vertical axis represents the surge voltage ΔVrrp and the horizontal axis represents the switching loss. The solid line is a curve connecting plotting points of measurement values obtained by varying the feedback gain in the electronic circuit 1U (turn-on basic model). The broken line is a curve connecting plotting points of measurement values obtained by varying the gate resistance Rg in the conventional electronic circuit.

As seen from FIG. 12, the surge voltage ΔVrrp can be made much smaller than in the conventional electronic circuit without increasing the switching loss by optimizing the feedback gain of the electronic circuit 1U (turn-on basic model), for example, by employing a feedback gain corresponding to the plotting point that is pointed by the white arrow in FIG. 12.

The electronic circuit 1 according to the invention was described with reference to FIG. 1. Then, the turn-off basic model of the electronic circuit 1 was described with reference to FIGS. 5, 6, etc. and the turn-on basic model of the electronic circuit 1U was described with reference to FIGS. 10, 11, etc.

The thus-described electronic circuit 1 can provide the following advantages (1) and (2):

(1) Since the semiconductor device drive circuit 13 of the electronic circuit 1 is equipped with the di/dt feedback unit 23 capable of performing the di/dt self-feedback operation, the tradeoff characteristic of the surge voltage and the switching loss can be improved.

(2) The surge voltage can be made much smaller than in the conventional case at the time of turn-off without increasing the switching loss by using the di/dt self-feedback operation at the time of turn-off, that is, employing the turn-off basic model of the electronic circuit 1 shown in FIG. 5.

The suppression of the surge voltage leads to an advantage that the IGBT 11 can operate to close to its breakdown voltage. Maintaining (not increasing) the switching loss suppresses variations among products of the IGBT 11, which leads to an advantage that the entire electronic circuit 1 can be miniaturized and reduced in costs through reduction in design margins.

(3) On the other hand, the surge voltage can be made much smaller than in the conventional case also at the time of turn-on without increasing the switching loss by using the di/dt self-feedback operation at the time of turn-on, that is, employing the turn-on basic model of the electronic circuit 1U shown in FIG. 9.

Although the turn-off basic model and the turn-on basic model have been described above as separate models for the sake of convenience, they are not mutually exclusive and can be used in combination as described in implementation forms of the electronic circuit 1 to be described below.

Next, three implementation forms will be described as embodiments of the electronic circuit 1 which can provide the above advantages (1)-(3). The three implementation forms will be referred to as a first electronic circuit implementation form, a second electronic circuit implementation form, and a third electronic circuit implementation form and will be described below individually in this order.

<First Electronic Circuit Implementation Form>

Figure 13:
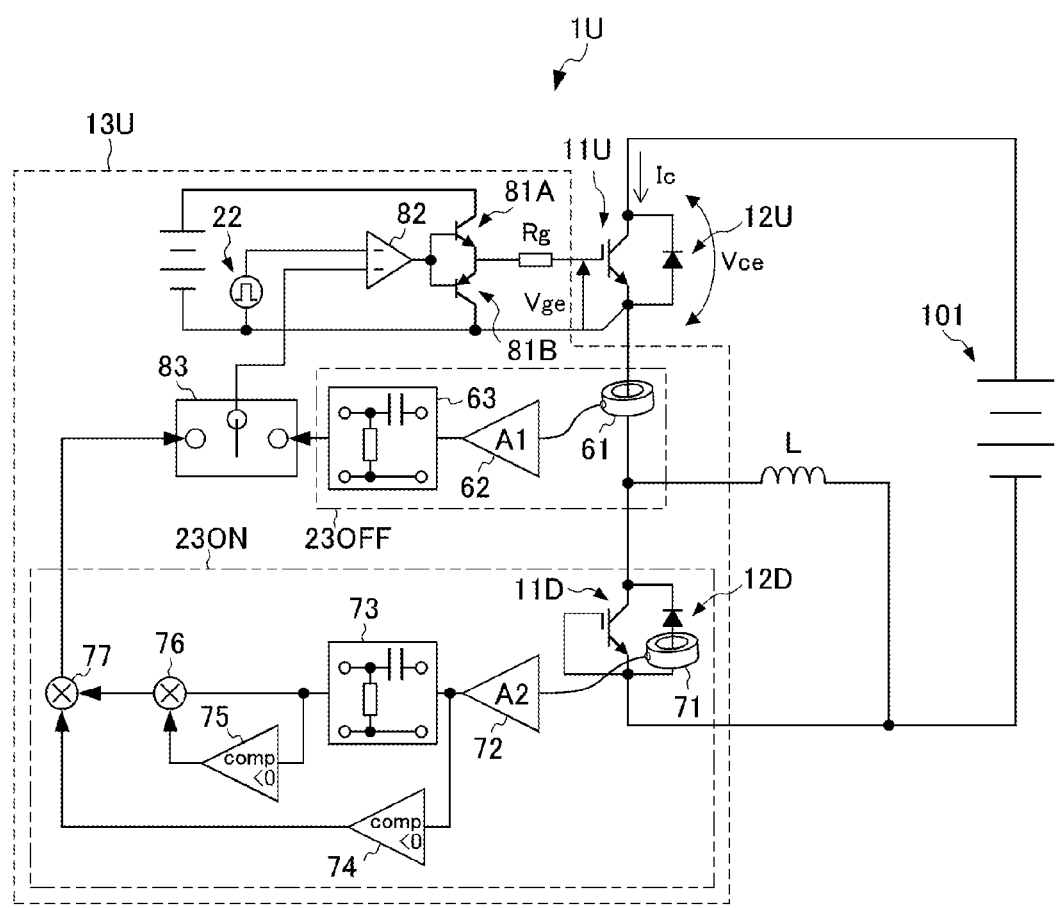
FIG. 13 shows an example configuration of part of an inverter which incorporates the electronic circuit of FIG. 9.

FIG. 13 shows an example configuration of part of an inverter which incorporates the electronic circuit 1U. As shown in FIG. 13, the IGBTs 11U and 11D are connected to each other in series in the same direction. Although not shown in FIG. 13, the electronic circuit including the IGBT 11D is equipped with a circuit having the same configuration and functions as a semiconductor device drive circuit 13U shown in FIG. 13.

The series connection of the IGBTs 11U and 11D is parallel-connected to a main circuit power source 101 and a smoothing capacitor (not shown). More specifically, the positive-pole terminal of the main circuit power source 101 is connected to the collector side of the IGBT 11U of the electronic circuit 1U and its negative-pole terminal is connected to the emitter side of the IGBT 11D.

For example, where this inverter is employed as an electric vehicle inverter, plural units (e.g., three units) of IGBTs (each unit is a series-connection of the IGBT 11U of the electronic circuit 1U and the IGBT 11D of the non-illustrated electronic circuit) are parallel-connected to a three-phase load of a synchronous motor.

The semiconductor device drive circuit 13U is equipped with a gate resistor 21, a voltage source 22, a turn-off di/dt feedback unit 23OFF, a turn-on di/dt feedback unit 23ON, transistors 81A and 81B, an adder 82, and a switching unit 83.

The semiconductor device drive circuit 13U of FIG. 13 is different from the semiconductor device drive circuits 13 of FIGS. 1 and 5 in that the transistors 81A and 81B are newly provided and the circuit configuration is changed accordingly. This is to increase the current capacity. That is, the semiconductor device drive circuit 13U of FIG. 13 includes an IGBT driving buffer circuit (push-pull circuit) consisting of transistors which is used commonly in the art.

The turn-off di/dt feedback unit 23OFF incorporates the di/dt feedback unit 23 of the electronic circuit 1 (turn-off basic model) of FIGS. 5 and 6. The turn-off di/dt feedback unit 23OFF is equipped with a current detecting unit 61, a gain unit 62, and a differentiation unit 63. The current detecting unit 61 and the differentiation unit 63 correspond to the di/dt detecting unit 31 shown in FIG. 5. The gain unit 62 corresponds to the gain unit 32 shown in FIG. 5. The addition function of the adder 82 corresponds to the voltage source 33 shown in FIG. 5.

The turn-on di/dt feedback unit 23ON incorporates the di/dt feedback unit 23U of the electronic circuit 1U (turn-on basic model) of FIGS. 10 and 11. The turn-on di/dt feedback unit 23ON is equipped with a current detecting unit 71, a gain unit 72, a differentiation unit 73, comparison units 74 and 75, and multipliers 76 and 77.

The current detecting unit 71 and the differentiation unit 73 correspond to the di/dt detecting unit 51 shown in FIG. 9. The current detecting unit 71 also corresponds to the $I_{FWD}$ detecting unit 54 shown in FIG. 9. The gain unit 72 corresponds to the gain unit 52 shown in FIG. 9. The multiplier 77 corresponds to the multiplier 56 shown in FIG. 9.

The comparison units 74 and 75 and the multiplier 76 correspond to the $I_{FWD}$ direction judging unit 55. More specifically, the comparison unit 74 judges whether the direction of a commutation current $I_{FWD}$ is negative or not. The comparison unit 75 judges whether the time derivative of a commutation current $I_{FWD}$, that is, the time derivative dI/dt, is negative or not.

Only when the direction of the commutation current $I_{FWD}$ is negative and the time derivative of a commutation current $I_{FWD}$, that is, the time derivative dI/dt, is negative, the outputs of both comparison units 74 and 75 become "1" and an output signal of the differentiation unit 73 is output from the multiplier 77 and applied as a feedback voltage $V_{FB}$.

In the other cases, at least one of the outputs of both comparison units 74 and 75 becomes "0" and hence the output of the multiplier 77 also becomes "0." Therefore, application of a feedback voltage $V_{FB}$ is prohibited.

The switching unit 83 switches between received signals and outputs the selected signal to the adder 62. That is, the voltage of the selected one of the received signals is applied as a feedback voltage $V_{FB}$.

More specifically, when the IGBT 11U is turned off, the switching unit 83 selects an output signal of the turn-off di/dt feedback unit 23OFF and outputs its voltage as a feedback voltage $V_{FB}$.

On the other hand, when the IGBT 11U is turned on, the switching unit 83 selects an output signal of the turn-on di/dt feedback unit 23ON and outputs its voltage as a feedback voltage $V_{FB}$.

The electronic circuit 1U of FIG. 13 operates basically in the same manners as the electronic circuit 1 of FIG. 1, the electronic circuit 1 (turn-off basic model) of FIGS. 5 and 6, and the electronic circuit 1U (turn-on basic model) of FIGS. 10 and 11. Therefore, no description will be made of how the electronic circuit 1U of FIG. 13 operates.

Figure 14A:
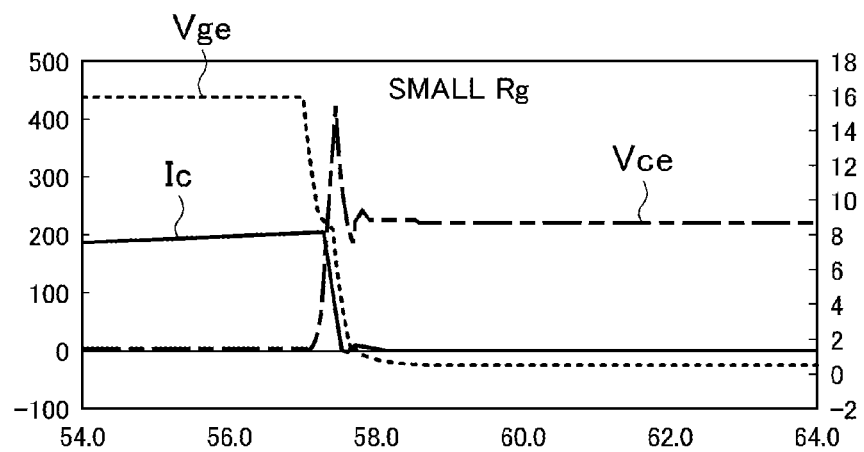
FIGS. 14A-14C are timing charts comparing operations of a conventional electronic circuit and the electronic circuit of FIG. 13 at the time of turn-off.
Figure 14B:
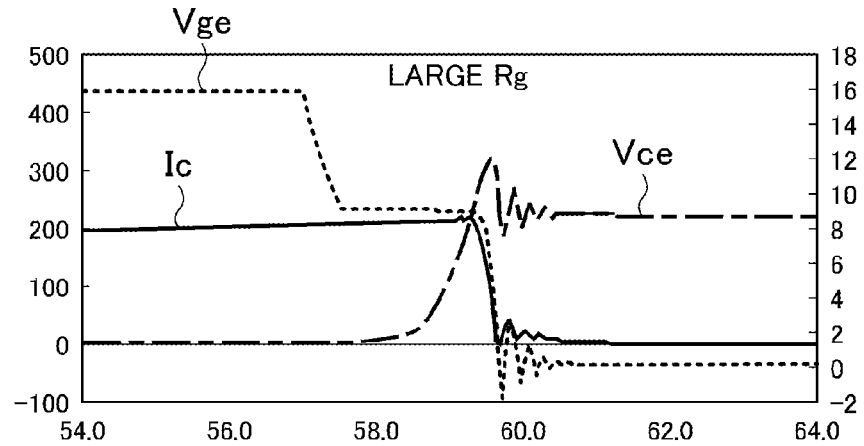
Figure 14C:
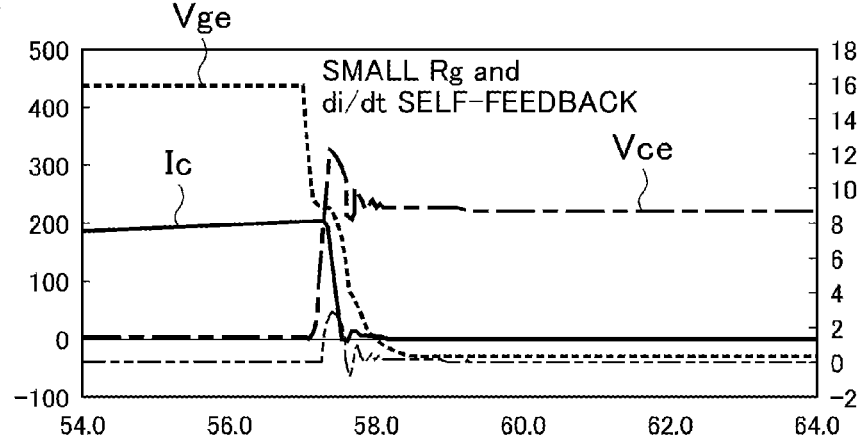

FIGS. 14A-14C are timing charts comparing operations of a conventional electronic circuit and the electronic circuit 1U of FIG. 13 at the time of turn-off. FIG. 14A is a timing chart of the conventional electronic circuit in a case that the resistance Rg of the gate resistor is small. FIG. 14B is a timing chart of the conventional electronic circuit in a case that the resistance Rg of the gate resistor is large. FIG. 14C is a timing chart of the electronic circuit 1U of FIG. 13 in a case that the resistance Rg of the gate resistor 21 is small.

In the conventional electronic circuit corresponding to FIG. 14A, the surge voltage was 201 V and the switching loss was 11 mJ. In the conventional electronic circuit corresponding to FIG. 14B, the surge voltage was 99 V and the switching loss was 37 mJ. In the electronic circuit 1U corresponding to FIG. 14C, the surge voltage was 100 V and the switching loss was 13 mJ.

It was confirmed that because of the use of the turn-off di/dt self-feedback operation the electronic circuit 1U of FIG. 13 provides an advantage that the surge voltage is reduced without changing the rise rate of the collector-emitter voltage Vce (i.e., without increasing the switching loss).

Figure 15A:
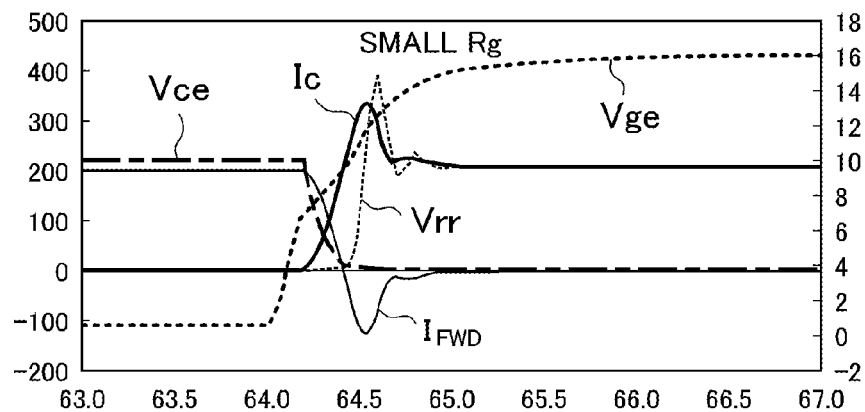
Figure 15B:
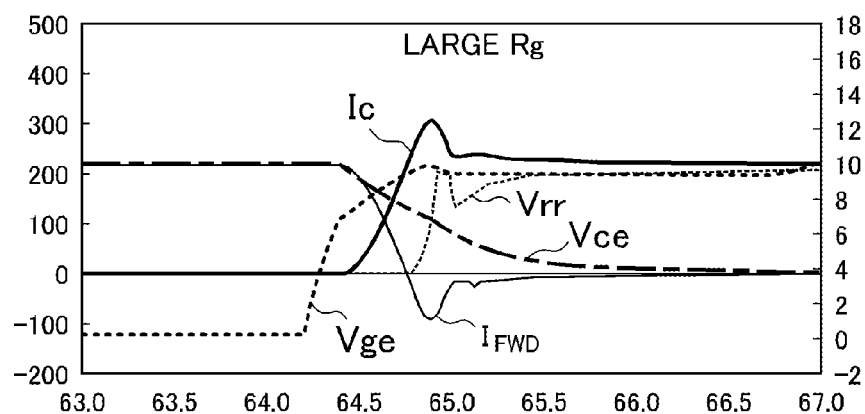
Figure 15C:
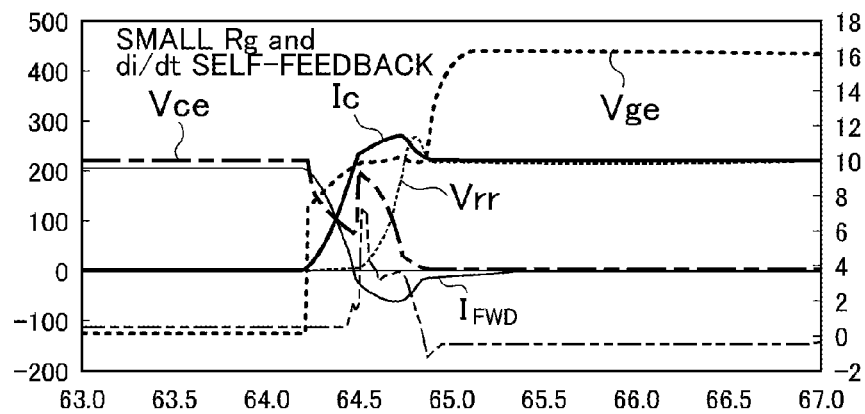

FIGS. 15A-15C are timing charts comparing operations of the conventional electronic circuit and the electronic circuit 1U of FIG. 13 at the time of turn-on. FIG. 15A is a timing chart of the conventional electronic circuit in a case that the resistance Rg of the gate resistor is small. FIG. 15B is a timing chart of the conventional electronic circuit in a case that the resistance Rg of the gate resistor is large. FIG. 15C is a timing chart of the electronic circuit 1U of FIG. 13 in a case that the resistance Rg of the gate resistor 21 is small.

In the conventional electronic circuit corresponding to FIG. 15A, the surge voltage was 167 V and the switching loss was 2 mJ. In the conventional electronic circuit corresponding to FIG. 15B, the surge voltage was −9 V and the switching loss was 20 mJ. In the electronic circuit 1U corresponding to FIG. 15C, the surge voltage was 47 V and the switching loss was 11 mJ.

It was confirmed that because of the use of the turn-on di/dt self-feedback operation the electronic circuit 1U of FIG. 13 provides an advantage that the surge voltage is reduced without changing the fall rate of the collector-emitter voltage Vce (i.e., without increasing the switching loss).

Furthermore, compare the switching waveforms (the waveforms of the collector-emitter voltage Vice) shown in FIGS. 14A-14C (turn-off) and those shown in FIGS. 15A-15C (turn-on) in terms of rise timing and fall timing under drive conditions that provide the same surge voltage. In particular, compare the switching waveforms shown in FIGS. 14A and 15A of the conventional electronic circuit in which the resistance Rg of the gate resistor is large with the switching waveforms shown in FIGS. 14C and 15C of the electronic circuit 1U.

It would be seen from the comparisons that when the di/dt self-feedback operation is used the dead time can be made shorter than in the case of using the gate driving method of the conventional electronic circuit for each of turn-off and turn-on. This means that the embodiment would be able to contribute to increase of the voltage utilization factor of PWM control and will make it possible to increase the efficiency of power conversion apparatus in the future.

Figure 16A:
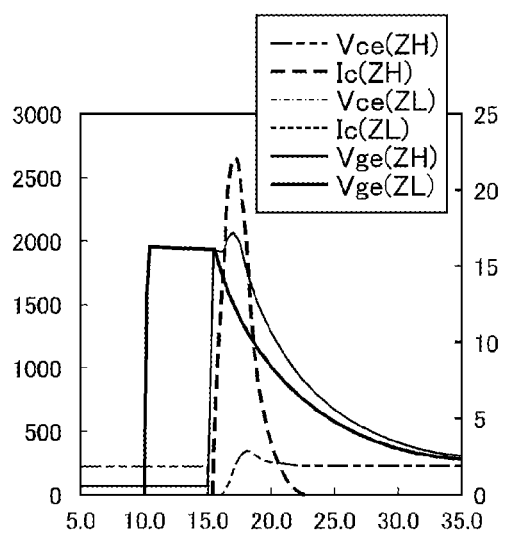
FIGS. 16A and 16B compare short-circuit cutoff characteristics of the conventional electronic circuit and the electronic circuit of FIG. 13.
Figure 16B:
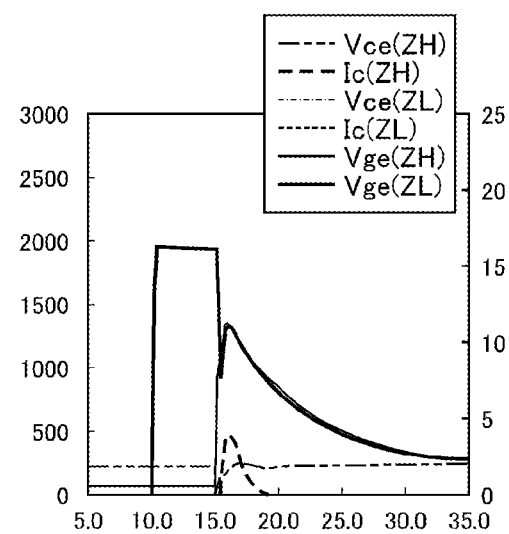

FIGS. 16A and 16B show short-circuit cutoff characteristics of the conventional electronic circuit and the electronic circuit 1U of FIG. 13, respectively, to compare them.

In the conventional circuit corresponding to FIG. 16A, the surge voltage was 137 V, the maximum current was 2,513 A, and the short-circuit loss was 1,145 mJ. In the electronic circuit 1U corresponding to FIG. 16B, the surge voltage was 37 V, the maximum current was 476 A, and the short-circuit loss was 150 mJ.

It has been found that the use of the di/dt self-feedback operation provides an advantage that the maximum current at the occurrence of a short circuit is reduced and hence the short-circuit loss is reduced. This makes it possible to simplify a short-circuit protection circuit and to design an IGBT while pursuing good loss performance.

Figure 17:
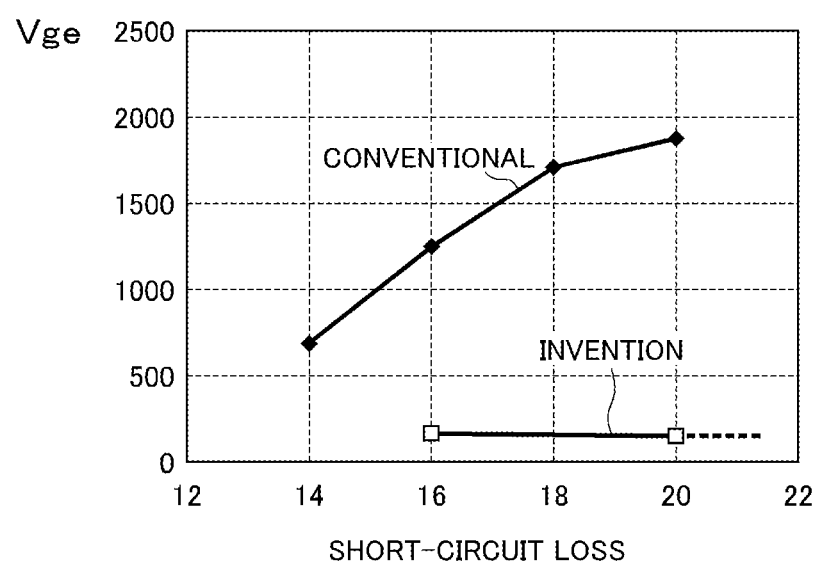
FIG. 17 compares the dependence of the short-circuit loss on the gate voltage of the conventional electronic circuit and that of the electronic circuit of FIG. 13.

FIG. 17 compares the dependence of the short-circuit loss on the gate voltage (gate-emitter voltage Vge) of the conventional electronic circuit and that of the electronic circuit 1U of FIG. 13. In FIG. 17, the vertical axis represents the gate-emitter voltage Vge (V) of the IGBT (in the case of FIG. 13, the IGBT 11U) and the horizontal axis represents the short-circuit loss (mJ/chip).

In IGBTs, in principle, a minimum conduction loss can be attained by setting the gate-emitter voltage Vge as high as possible.

However, in the gate driving method employed by the conventional electronic circuit, the short-circuit loss increases with the gate-emitter voltage Vge. Therefore, naturally, the gate-emitter voltage Vge has an upper limit value though it is prohibited to use an IGBT at a voltage that exceeds a breakdown voltage of the gate oxide film.

In contrast, it is seen that the use of the di/dt self-feedback operation according to the invention greatly lowers the dependence of the short-circuit loss on the gate voltage (gate-emitter voltage Vge). This makes it possible to not only reduce the loss of an IGBT but also relax the accuracy that is required of the gate drive power source, leading to further cost reduction.

As described above, the electronic circuit 1U of FIG. 13 is equipped with the semiconductor device drive circuit 13U which supplies a drive signal to the gate of a first semiconductor device to establish electrical continuity or disconnection in a bus by means of a series connection of the first semiconductor device and a second semiconductor device each of which has such a switching function as to be turned on or off according to the voltage of a drive signal applied to the gate, the collector and the emitter of each of which are inserted in the bus, and each of which is connected to a free wheeling diode in parallel.

In the example of FIG. 13, the first semiconductor device is the IGBT 11U and the second semiconductor device is the IGBT 11D. The free wheeling diodes that are parallel-connected to the first semiconductor device and the second semiconductor device are the FWDs 12U and 12D, respectively.

The semiconductor device drive circuit 13U is equipped with the turn-off di/dt feedback unit 23OFF and the turn-on di/dt feedback unit 23ON as feedback units for generating a feedback voltage $V_{FB}$ as part of the voltage of a drive signal according to a temporal variation of a current flowing through the bus.

When the first semiconductor device (in the example of FIG. 13, the IGBT 11U) is turned off, the turn-off di/dt feedback unit 23OFF generates a feedback voltage $V_{FB}$ according to a temporal variation of a collector current of the first semiconductor device (in the example of FIG. 13, a collector current Ic).

When the first semiconductor device (in the example of FIG. 13, the IGBT 11U) is turned on, the turn-on di/dt feedback unit 23ON generates a feedback voltage $V_{FB}$ on the basis of a commutation current (in the example of FIG. 13, a commutation current $I_{FWD}$ of the FWD 12D).

The turn-on di/dt feedback unit 23ON generates a feedback voltage $V_{FB}$ if the direction of the commutation current corresponds to a reverse recovery period, that is, it is in the direction from the cathode of the FWD 12D to the load L such as a motor (see FIG. 13). If not, the turn-on di/dt feedback unit 23ON does not generate a feedback voltage $V_{FB}$.

The electronic circuit 1U of FIG. 13 having the above configuration can naturally provide the above-mentioned advantages (1)-(3), and can also provide the following advantages (4)-(8):

(4) Because of the di/dt self-feedback operation, the feedback amount is adjusted automatically according to the characteristics of each semiconductor device such as the IGBT 11 (e.g., the switching speed at the time of turn-off or turn-on). This absorbs influences of characteristics variations among individual semiconductors. In other words, it becomes unnecessary to make adjustments for each semiconductor device.

(5) The di/dt self-feedback operation is performed only in a period when a surge voltage is generated and does not affect a rise or fall of the collector-emitter voltage Vice of the semiconductor device such as the IGBT 11. Therefore, the tradeoff characteristic of the surge voltage and the switching loss can be improved further. That is, the advantage (1) is enhanced.

(6) Even in the event of a rapid current increase, because of the di/dt self-feedback operation, the gate voltage (gate-emitter voltage Vge) is kept low and the saturation current is reduced, whereby the short-circuit capacity can be increased. As in the above advantage (4), this absorbs influences of a characteristic variation among individual semiconductors, in other words, makes it unnecessary to make adjustments for each semiconductor device.

(7) The resistance Rg of the soft cutoff gate resistor 21 can be set small and its setting range can be widened. As a result, it becomes unnecessary to determine the resistance Rg strictly by carrying out tests etc.

(8) It becomes possible to automatically eliminate influences of not only characteristics variations among individual semiconductor devices but also differences in circuit impedances (stray inductances and resistances) among individual electronic circuits 1.

<Second Electronic Circuit Implementation Form>

Figure 18A:
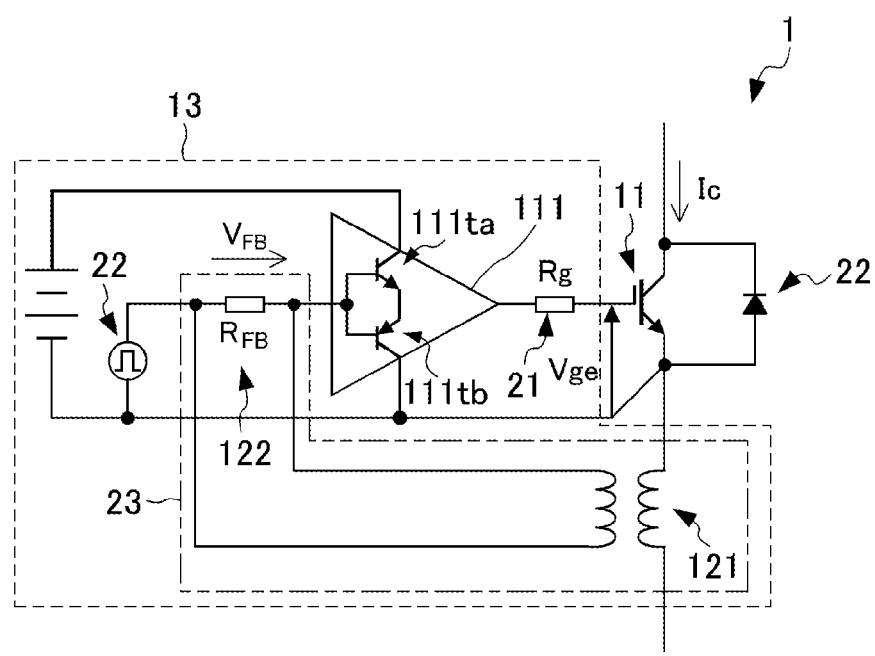
FIGS. 18A and 18B show an example configuration of part of an inverter which incorporates an electronic circuit corresponding to the electronic circuit of FIG. 1 and which is different from the example of FIG. 13.
Figure 18B:
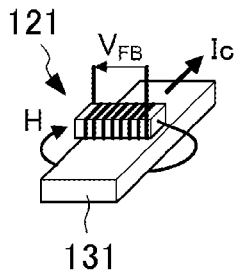

FIGS. 18A and 18B show an example configuration of part of an inverter which incorporates an electronic circuit 1 and which is different from the example of FIG. 13. FIG. 18A is a circuit diagram of an electronic circuit (hereinafter also referred to as an electronic circuit 1) corresponding to the electronic circuit 1 of FIG. 1. FIG. 18B is a perspective view showing a general appearance of a transformer 121 which is one component of the electronic circuit 1.

A semiconductor device drive circuit 13 of the electronic circuit 1 of FIG. 18A is equipped with a gate resistor 21, a power source 22, a di/dt feedback unit 23, and a buffer 111. The buffer 111 is at least part of an IGBT driving buffer circuit (push-pull circuit) which is of a commonly employed type and is composed of transistors 111ta and 111tb.

The semiconductor device drive circuit 13 of FIG. 18A is different from the semiconductor device drive circuits 13 of FIGS. 1 and 5 in that the buffer 111 is newly provided and the circuit configuration is changed accordingly. This is to increase the current capacity. That is, the semiconductor device drive circuit 13 of FIG. 18A includes an IGBT driving buffer circuit (push-pull circuit) consisting of transistors which is used commonly in the art.

The di/dt feedback unit 23 shown in FIG. 18A corresponds to the di/dt feedback unit 23 of the electronic circuit 1 (turn-off basic model) of FIGS. 5 and 6, and is equipped with the transformer 121 and a resistor 122.

More specifically, the transformer 121 corresponds to the di/dt detecting unit 31 and the gain unit 32 shown in FIG. 5. The resistor 122 is provided in the path that connects the voltage source 22 and the buffer 111, and both ends of the resistor 122 are connected to the secondary side of the transformer 121. The resistor 122 thus corresponds to the voltage source 33 shown in FIG. 5.

The di/dt feedback unit 23 shown in FIG. 18A magnetically couples the main current path through which a collector current Ic (main current) of the IGBT 11 flows to the gate current path through which a gate current flows.

In this case, the feedback voltage $V_{FB}$ is given by the following Equation (12):

$$V_{FB} = k * \sqrt{L_{sec} * L_p} \cdot \frac{dI_{ce}}{dt} \quad (12)$$

In Equation (12), k is the coupling coefficient of the coupling between the primary side and the secondary side of the transformer 121, Lp is the primary-side inductance of the transformer 121, Lsec is the secondary-side inductance of the transformer 121, and Ice is the collector-emitter current (equivalent to the collector current Ic) of the IGBT 11.

As shown in FIG. 18B, the transformer 121 is placed on the bar of a bus 131 which is the main current path through which a collector current Ic (main current) of the IGBT 11 flows.

As mentioned above, the semiconductor device drive circuit 13 shown in FIG. 18A includes the IGBT driving buffer circuit (push-pull circuit) which is of a commonly employed type and is composed of transistors 111ta and 111tb. Therefore, a base resistor itself of this buffer circuit can be used as the resistor 122.

An electromotive force generated by the transformer 121 supplies a current that is consumed by the resistor 122 and a current that turns on the transistor 111ta of the buffer 111 again or turns on the transistor 111tb. And an amplified current is supplied to the gate of the IGBT 11 via the transistor 111ta or 111tb of the buffer 111 in such a direction as to charge or discharge the gate capacitance of the IGBT 11. That is, between the currents generated by the secondary coil of the transformer 121, the current flowing through the transistor 111ta or 111tb of the buffer 111 is amplified by a factor that is equal to a current amplification gain hef of the transistor 111ta or 111tb of the buffer 111. This allows the transformer 121 having a smaller inductance to perform the di/dt self-feedback operation. Although not shown in any drawing, it is also possible to form the buffer 111 using MOSFETs, in which case the same advantage is obtained.

As described above, as shown in FIG. 18, the di/dt feedback unit 23 can be implemented by the very simple circuit in which the secondary side of the transformer 121 is merely connected to both ends of the base resistor 122 in parallel.

As shown in FIG. 18B, an electromotive force Ldi/dt is generated in such a manner that a magnetic field H that is generated when a collector current Ic (main current) of the IGBT 11 flows through the bus 131 which is the main current path is coupled with the transformer 121. The electromotive force Ldi/dt is input (fed back negatively) to the gate of the IGBT 11.

With the above-configured di/dt feedback unit 23 shown in FIGS. 18A and 18B, the gain (in this example, the degree of coupling with the coil) that determines the feedback amount can be adjusted in advance. Performing such an adjustment properly enables negative feedback to the gate according to a current variation rate in a transition period of a switching operation, that is, the di/dt self-feedback operation. Since no reaction occurs to an irrelevant current variation, it is expected that the switching loss is reduced greatly.

The magnetic circuit to form the di/dt feedback unit 23 shown in FIG. 18A can be implemented by a very simple structure that the transformer 121 is merely bonded to the bar of the bus 131 of the main circuit (see FIG. 18B) by, for example, employing, as the transformer 121, an insulating transformer that is configured by forming a coil pattern on the bus 131 of a printed circuit board.

In this case, since the magnetic circuit is insulated, a signal can be taken from any position on the bus 131. Furthermore, where the di/dt feedback unit 23 shown in FIG. 18A is formed on a circuit board such as a printed circuit board, the electronic circuit 1 of FIG. 18A can be implemented without adding any component to the conventional electronic circuit and hence cost reduction is enabled.

Still further, employing the transformer 121 as a component of the di/dt feedback unit 23 provides the following auxiliary advantage. That is, since the circuit is configured so that the energy stored in the stray inductance of the existing bus 131 is consumed on the secondary side of the transformer 121, the effective inductance is decreased and hence the serge voltage is reduced. In the example of FIGS. 18A and 18B, the energy stored in the stray inductance is consumed to produce Joule heat and a base current in the resistor 122 which serves as the base resistor of the buffer circuit 111.

Incidentally, as in the di/dt feedback unit 23 shown in FIGS. 18A and 18B, a magnetic circuit which magnetically couples the main current path (bus) through which a commutation current $I_{FWD}$ of the commutation-side FWD 12D (not shown in FIG. 18A) flows to the gate current path through a gate current flows can be incorporated in the di/dt feedback unit 23U of the electronic circuit 1U (turn-on basic model) of FIGS. 9 and 10.

However, in inverters, series connections of the upper electronic circuit 1U and the lower electronic circuit 1D (the latter is not shown in FIG. 9) are used. In this case, it is necessary to take current signals from the upper electronic circuit 1U and the lower electronic circuit 1D in a crossed manner. Taking also the configuration of the turn-off-side di/dt feedback unit 23 into consideration, it is expected that the circuit configurations and the physical structures of the electronic circuits 1U and 1D would become complex.

Practically, to reduce the number of components and secure the independence of each of the upper electronic circuit 1U and the lower electronic circuit 1D (factors of lowering the degree of freedom of designing), it is necessary to employ a method with which each of the upper electronic circuit 1U and the lower electronic circuit 1D is complete in functionality.

FIG. 19 shows an example method of such a type. In FIG. 19, waveforms of the upper electronic circuit 1U are given a parenthesized suffix "hi" and waveforms of the upper electronic circuit 1D (not shown in FIG. 9) are given a parenthesized suffix "lo."

As shown in FIG. 19, a commutation current $I_{FWD}$(lo) of the FWD 12D has a feature that it is superimposed as a short-circuit current on a collector current Ic of the IGBT 11U being turned on. The use of this feature enables a technique of indirectly observing a current variation of the FWD 12D by means of the turn-on-side transformer 121. This technique enables common use of components, whereby cost increase is suppressed and each of the upper electronic circuit 1U and the lower electronic circuit 1D can be complete in functionality.

As a result, plural electronic circuits 1 can be implemented and the surge voltage can be adjusted automatically at the time of each of turn-off and turn-on by a simple configuration that one transformer 121 is disposed adjacent to a closest portion of a bus (the bus 131 or the like) for each power semiconductor device such as an IGBT 11.

As described above, the electronic circuit 1 of FIGS. 18A and 18B is equipped with the semiconductor device drive circuit 13 which supplies a drive signal to the gate of a semiconductor device to establish electrical continuity or disconnection in a bus by means of the semiconductor device which has such a switching function as to be turned on or off according to the voltage of a drive signal applied to the gate and whose collector and emitter of which are inserted in the bus.

In the example of FIGS. 18A and 18B, the semiconductor device is the IGBT 11.

The semiconductor device drive circuit 13 is equipped with the buffer circuit including the base resistor (in the example of FIG. 18A, buffer circuit is composed of the resistor 122 as the base resistor and the buffer 111) and the di/dt feedback unit 23 which generates a feedback voltage $V_{FB}$ as part of the voltage of a drive signal according to a temporal variation of a current flowing through the bus.

The di/dt feedback unit 23 has the transformer 121, and the secondary side of the transformer 121 is connected to both ends of the base resistor (in the example of FIG. 18A, the resistor 122) of the buffer circuit.

The electronic circuit 1 of FIGS. 18A and 18B having the above configuration can naturally provide the above-mentioned advantages (1)-(3), and can also provide the following advantages (9)-(11):

(9) In the di/dt feedback unit 23 shown in FIGS. 18A and 18B, the transformer 121 can be small in size because the gains of the transistors can be utilized through (current) feedback to the base of the buffer circuit.

In other words, the di/dt self-feedback operation can be realized by a very small signal. For example, a sufficient feedback gain can be obtained if the transformer 121 has an inductance of several nanohenries.

The advantages of the di/dt self-feedback operation can be enjoyed even if the transformer 121 is a coreless transformer. In this case, an ideal current (di/dt) sensing function can be realized in which, for example, because no core material is used, influence of temperature is completely negligible and a current flowing through the bus 131 (main current path) can be observed directly without delay.

(10) The di/dt feedback unit 23 shown in FIGS. 18A and 18B is configured in such a manner that the existing base resistor (used conventionally) is used as the base resistor and the secondary side of the transformer 121 is connected to the resistor 122 in parallel. Therefore, the switching operation can be continued even if the transformer 121 suffers an open failure.

(11) From the viewpoint of an inverter as a whole incorporating plural electronic circuits 1 of FIG. 18A, only one transformer 121 is added for each IGBT 11. The switching operation with the di/dt self-feedback operation can be realized without adding any active devices.

<Third Electronic Circuit Implementation Form>

First, background techniques of a third electronic circuit implementation form will be described.

Assume that series connections of the upper electronic circuit 1U (turn-on basic model) of FIG. 9 and the lower electronic circuit 1D having the same configuration (not shown in FIG. 9) are incorporated in an inverter. FIG. 19 is an example turn-on timing chart of such a case.

FIG. 20A shows a current irr (hereinafter referred to as a reverse recovery current irr) which flows when excess carriers Qrr stored in the base layer of the lower FWD 12D are released in an interval trrb shown in FIG. 19.

FIG. 20A shows waveforms of the collector current Ic and the collector-emitter voltage Vice of the upper IGBT 11U and the commutation current $I_{FED}$ of the lower FWD 12D in the period trrb shown in FIG. 19.

FIG. 20B shows an equivalent circuit through which the reverse recovery current irr flows. In FIG. 20B, R(igbt) represents the resistance of the upper IGBT 11U in a reverse recovery interval.

As shown in FIG. 20B, if the amount of carriers stored in the base layer of the lower FWD 12D is excessive, a reverse recovery current irr corresponding to excess carriers Qrr flows as a commutation current $I_{FWD}$ so as to be superimposed on the collector current Ic of the upper IGBT 11U, which is a factor that plays a role in the generation of a surge voltage in a voltage Vrr across the lower FWD 12D.

Figure 21:
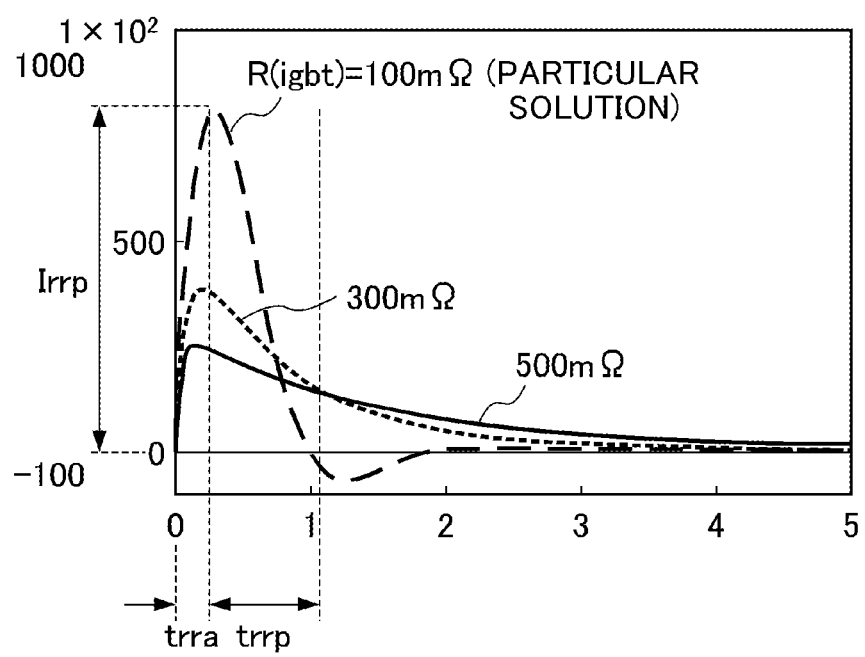
FIG. 21 shows waveforms of a reverse recovery current corresponding to several values of the resistance of an upper IGBT in a reverse recovery interval.

FIG. 21 shows waveforms of the reverse recovery current irr in the cases where the resistance R(igbt) of the upper IGBT 11U in the reverse recovery interval is 100, 300, and 500 mΩ), respectively.

As seen from FIG. 21, the peak value Irrp of the reverse recovery current irr decreases and its temporal variation (slope) becomes gentler as the resistance R(igbt) of the upper IGBT 11U in the reverse recovery interval increases.

That is, the magnitude of the peak value Irrp of the reverse recovery current irr depends on the magnitude of the surge voltage in the voltage Vrr across the lower FWD 12D. Therefore, the surge voltage is made lower as the resistance R(igbt) of the upper IGBT 11U in the reverse recovery interval increases. It is concluded that the surge voltage in the voltage Vrr across the lower FWD 12D can be reduced by decreasing the magnitude of the peak value Irrp of the reverse recovery current irr by making a saturation current sufficiently small in a process that excess carriers Qrr stored in the base layer of the lower FWD 12D are released.

As described above, when the upper IGBT 11U is turned on, a reverse recovery current irr flows when excess carriers Qrr stored in the base layer of the lower FWD 12D are released. A temporal variation of the reverse recovery current irr results in a temporal variation of the commutation current $I_{FWD}$ of the lower FWD 12D, that is, a temporal variation of the collector current Ic of the upper IGBT 11U, in the interval trrb shown in FIG. 19. If these temporal current variations are steep, a surge voltage is generated in the voltage Vrr of the lower FWD 12D.

To reduce the surge voltage, it is necessary to suppress the above temporal current variations in the interval trrb. To this end, it is necessary to turn off the lower IGBT 11D in advance so that it goes deep into the saturation region.

On the other hand, it is preferable not to start a di/dt self-feedback operation until immediately before the start of a reverse recovery interval of the lower FWD 12D to thereby cause a rapid fall of the collector-emitter voltage Vice of the upper IGBT 11U and minimize increase of the switching loss.

Example methods for enabling the above operation are a method of performing a time control using a switch and a method of delaying a di/dt self-feedback operation intentionally by inserting a delay filter circuit having a signal transmission delaying function (first-order delay) such as a low-pass filter (LPF). The latter method will be referred to as an LPF insertion method.

Figure 22:
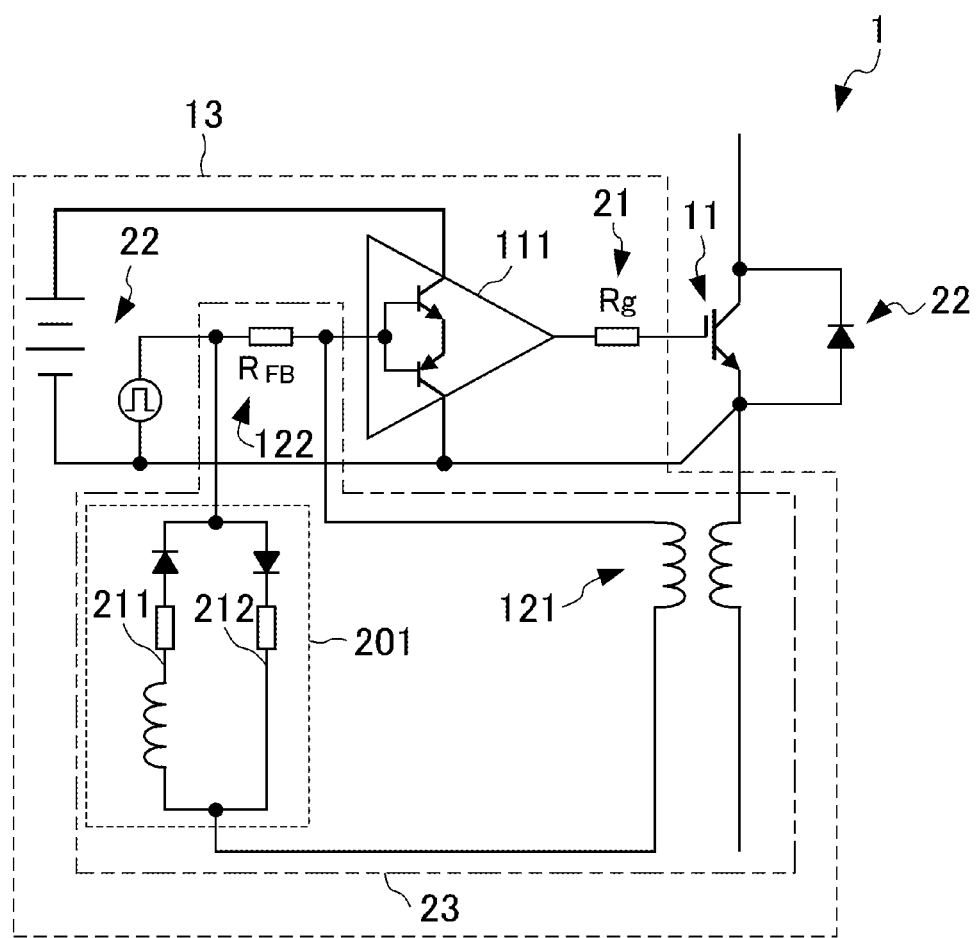
FIG. 22 shows an example configuration of part of an inverter incorporating an electronic circuit which corresponds to the electronic circuit of FIG. 1 and which is different in configuration from the electronic circuit of FIG. 18A in that an LPF insertion method is applied.

FIG. 22 shows another example configuration of an electronic circuit corresponding to the electronic circuit of FIG. 1. This configuration is different from the configuration of FIG. 18A in that the LPF insertion method is applied. Therefore, components in FIG. 22 having the same components in FIG. 18A are given the same reference symbols and will not be described in detail.

The configuration of FIG. 22 is different from that of FIG. 18A in that in the di/dt feedback unit 23 shown in FIG. 22 an LPF circuit 201 is inserted between the secondary side of the transformer 121 and both ends of the resistor 122 which is the base resistor of the buffer circuit.

To realize the turn-on di/dt self-feedback operation using the di/dt feedback unit 23 shown in FIG. 22, it is preferable to use the method that was described above with reference to FIG. 19. More specifically, where series connections of an upper electronic circuit 1U and a lower electronic circuit 1D (the latter is not shown in FIG. 22) are used, it is preferable to use the method with which each of the upper electronic circuit 1U and the lower electronic circuit 1D is complete in functionality.

Like the di/dt feedback unit 23 shown in FIG. 18A, the di/dt feedback unit 23 shown in FIG. 22 the conventional switching operation can be maintained even if the transformer 121 suffers an open failure.

As shown in FIG. 22, the LPF circuit 201 is provided with two current paths having respective rectification devices (in the example of FIG. 22, rectification diodes) that are in opposite directions. This makes it possible to adjust a turn-on switching characteristic and a turn-off switching characteristic using only the transformer 121.

The current flowing through the bus in which electrical continuity or disconnection is established by the IGBT 11 varies differently when the IGBT 11 is turned off and when it is turned on. That is, whereas the current decreases when the IGBT 11 is turned off, the current increases when the IGBT 11 is turned on. Therefore, electromotive forces opposite in direction are generated on the secondary side of the transformer 121. In the LPF circuit 201, because of the presence of the two rectification devices (in the example of FIG. 22, rectification diodes), the current path branch off into a turn-on current path 212 and a turn-off current path 211. Therefore, the turn-off characteristic and the turn-on characteristic can be adjusted to optimum ones by adding, as appropriate, devices that function as a filter and an attenuator in each of the paths 211 and 212.

For example, in the LPF circuit 201 shown in FIG. 22, an RL circuit consisting of a resistor having a resistance R and a coil having an inductance Ld is added as an LPF (first-order delay) in the turn-on current path 211. That is, the delay time (time constant) can be adjusted easily and properly by varying the inductance Ld.

Applying the LPF insertion method provides an advantages that the tradeoff characteristic of the surge voltage and the switching loss can be improved in an ideal manner. And this advantage means that the switching speed of each IGBT can be optimized automatically even if it is deviated.

Whereas in the conventional techniques disclosed in Patent document 1 etc. it is necessary that control parameters be set so as to be suitable for a worst IGBT characteristic, the use of the LPF insertion method provides an advantage that any IGBT can be driven automatically in an optimum state when it is used as an IGBT 11.

FIGS. 23A-23F are timing charts comparing turn-off operations of the electronic circuit 1 of FIG. 22 corresponding to varied LPF delay times (values of inductance Ld).

Figure 23A:
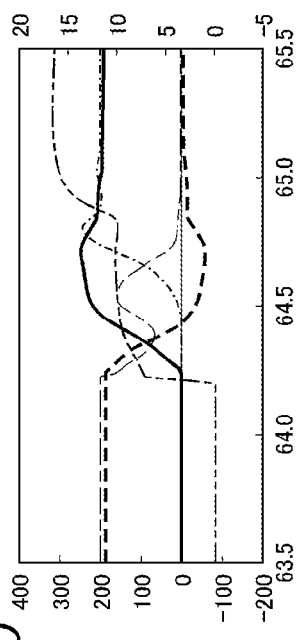
FIGS. 23A-23F are timing charts comparing turn-off operations of the electronic circuit 1 of FIG. 22 corresponding to varied LPF delay times.
Figure 23B:
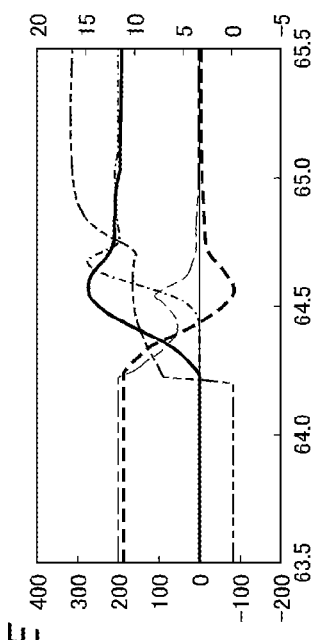
Figure 23C:
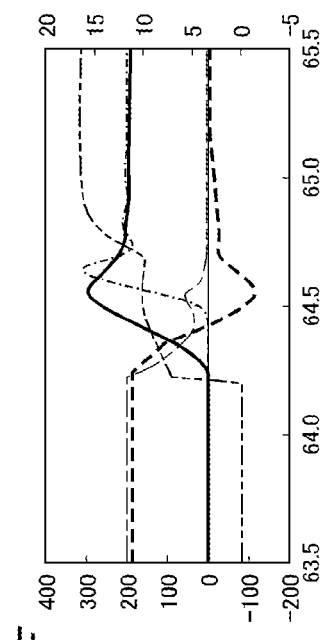
Figure 23D:
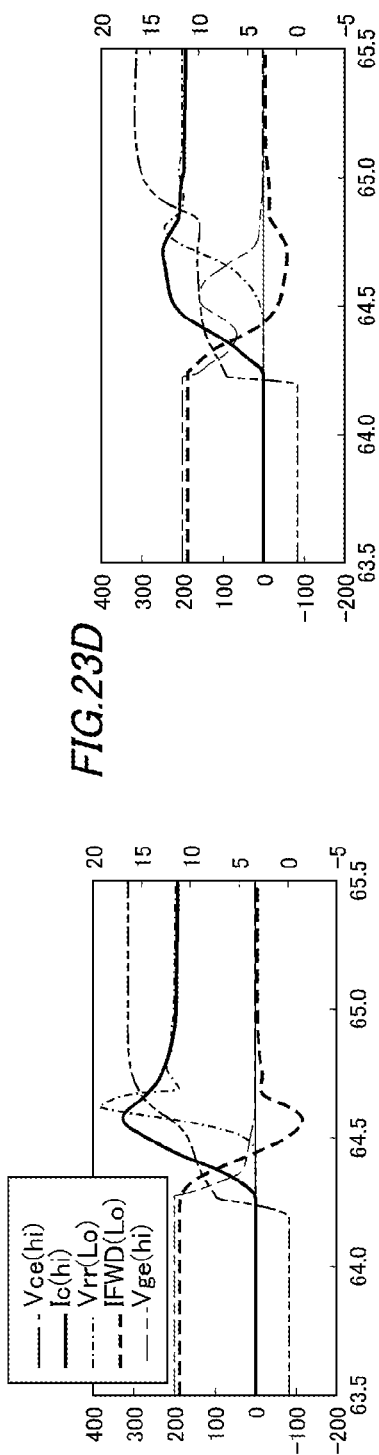
Figure 23E:
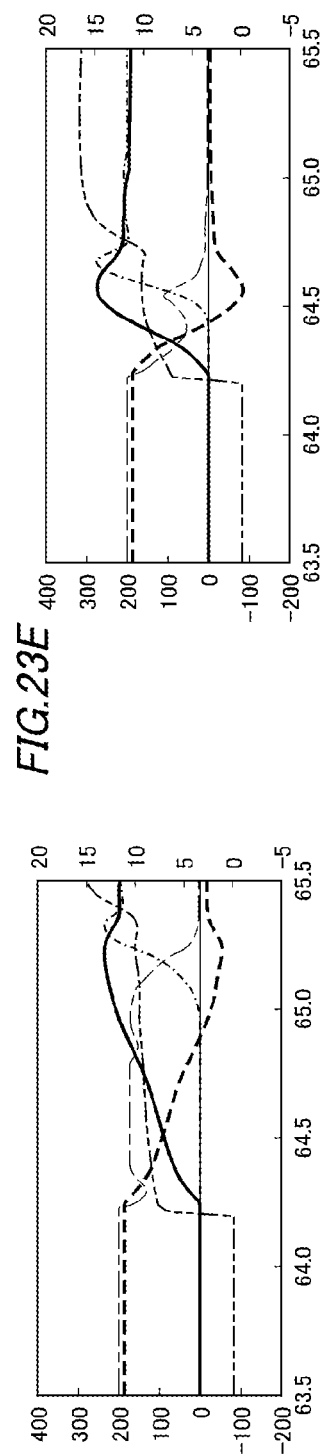
Figure 23F:
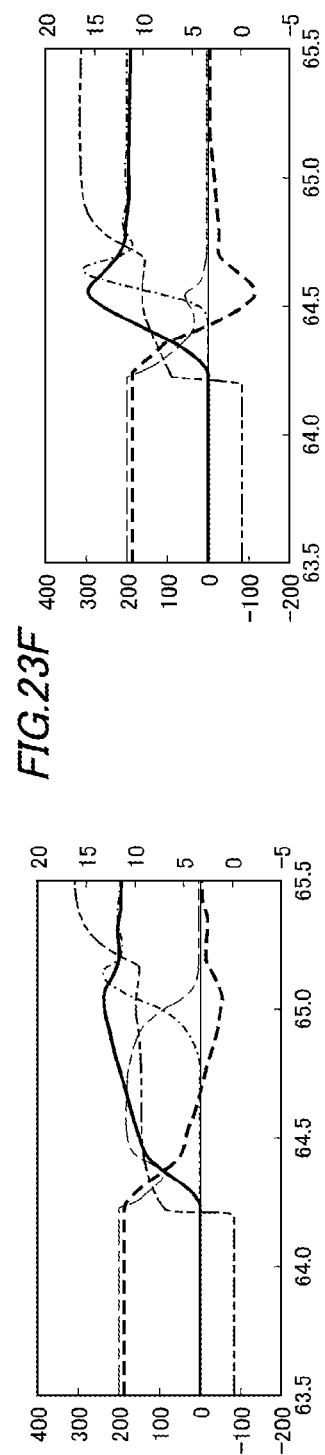

FIG. 23A is a timing chart of a conventional electronic circuit for reference. FIG. 23B is a timing chart of the electronic circuit 1 of FIG. 22 in a case that the inductance Ld is equal to 101 µH. FIG. 23C is a timing chart of the electronic circuit 1 of FIG. 22 in a case that the inductance Ld is equal to 50 µH. FIG. 23D is a timing chart of the electronic circuit 1 of FIG. 22 in a case that the inductance Ld is equal to 100 µH. FIG. 23E is a timing chart of the electronic circuit 1 of FIG. 22 in a case that the inductance Ld is equal to 150 µH. FIG. 23F is a timing chart of the electronic circuit 1 of FIG. 22 in a case that the inductance Ld is equal to 200 µH.

As seen from FIGS. 23A-23F, it was confirmed that an advantage that the surge voltage in the voltage Vrr of the commutation-side FWD 12D is reduced while a steep fall of the collector-emitter voltage Vce is maintained (i.e., without increasing the switching loss) can be obtained through the turn-on di/dt self-feedback operation by adjusting the LPF delay time (inductance Ld) properly.

Figure 24:
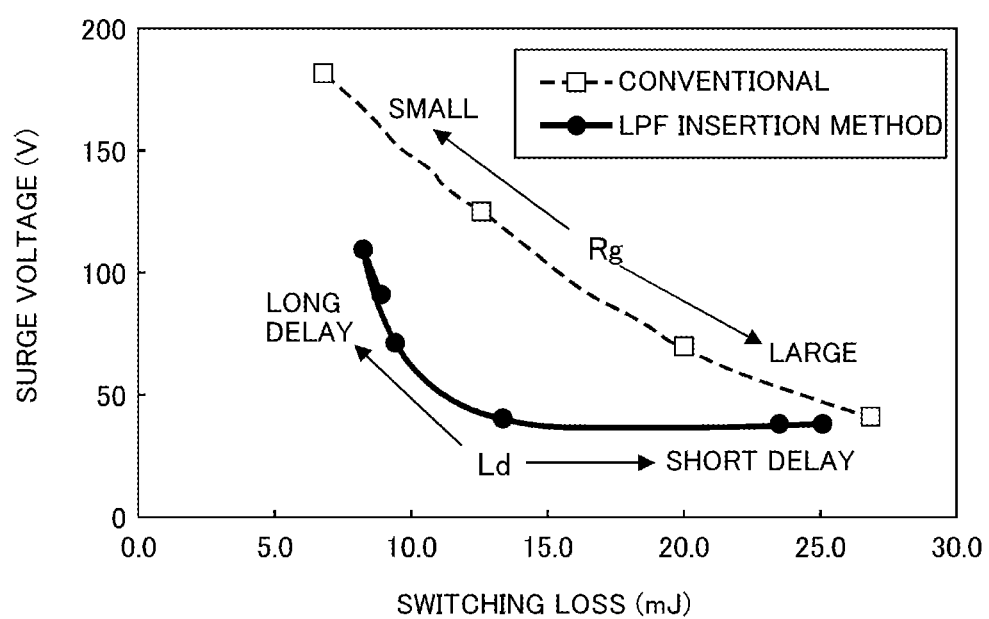
FIG. 24 shows example relationships between the surge voltage and the switching loss that occur at the time of turn-on in each of the electronic circuit of FIG. 22 and a conventional electronic circuit.

FIG. 24 shows example relationships between the surge voltage and the switching loss that occur at the time of turn-on in each of the electronic circuit of FIG. 22 which employs the LPF insertion method and the conventional electronic circuit. In FIG. 24, the vertical axis represents the surge voltage and the horizontal axis represents the switching loss. The solid line is a curve connecting plotting points of measurement values obtained by varying the LPF delay time (inductance Ld) in the electronic circuit 1 of FIG. 22 which employs the LPF insertion method. The broken line is a curve connecting plotting points of measurement values obtained by varying the gate resistance Rg in the conventional electronic circuit.

As seen from FIG. 24, the surge voltage can be made much smaller than in the conventional electronic circuit without increasing the switching loss by optimizing the LPF delay time (inductance Ld) of the electronic circuit 1 of FIG. 22, for example, by employing an inductance Ld corresponding to the plotting point located right above the symbol "Ld" in FIG. 24.

As described above, the electronic circuit 1 of FIG. 22 is equipped with the semiconductor device drive circuit 13 which supplies a drive signal to the gate of a first semiconductor device to establish electrical continuity or disconnection in a bus by means of a series connection of the first semiconductor device and a second semiconductor device each of which has such a switching function as to be turned on or off according to the voltage of a drive signal applied to the gate, the collector and the emitter of each of which are inserted in the bus, and each of which is connected to a freewheeling diode in parallel.

Although the only one electronic circuit 1 is shown in the example of FIG. 22, it is the upper one (corresponds to the electronic circuit 1U in other examples) of upper and lower electronic circuits 1 which are incorporated in an inverter or the like.

The first semiconductor device is the IGBT 11U (in the example of FIG. 22, IGBT 11) and the second semiconductor device is the IGBT 11D (not shown in FIG. 22). The free wheeling diodes that are parallel-connected to the first semiconductor device and the second semiconductor device are an FWD 12U (in the example of FIG. 22, FWD 12) and an FWD 12D (not shown in FIG. 22), respectively.

The semiconductor device drive circuit 13 is equipped with the di/dt feedback unit 23 which generates a feedback voltage $V_{FB}$ as part of the voltage of a drive signal according to a temporal variation of a current flowing through the bus.

When the first semiconductor device (in the example of FIG. 22, the IGBT 11) is turned off, the di/dt feedback unit 23 generates a feedback voltage $V_{FB}$ according to a temporal variation of a collector current of the first semiconductor device (in the example of FIG. 22, a collector current Ic of the IGBT 11).

When the first semiconductor device (in the example of FIG. 22, the IGBT 11) is turned on, the di/dt feedback unit 23 generates a feedback voltage $V_{FB}$ on the basis of a temporal variation of a commutation current flowing through the free wheeling diode associated with the second semiconductor device (in the example of FIG. 22, a commutation current $I_{FWD}$ flowing through the free wheeling diode 12D (not shown in FIG. 22)).

The thus configured di/dt feedback unit 23 is equipped with the LPF circuit 201 as the delay filter for delaying the timing of applying a feedback voltage $V_{FB}$ to the gate of IGBT 11 as part of the voltage of a drive signal.

The electronic circuit 1 of FIG. 22 having the above configuration can naturally provide the above-mentioned advantages (1)-(3), and can also provide the following advantage (12):

(12) At the time of turn-on switching, the surge voltage in the voltage Vrr of the free wheeling diode can be reduced while a steep fall of the collector-emitter voltage Vice is maintained (i.e., without increasing the switching loss) through the di/dt self-feedback operation by adjusting the delay time of the delay filter (in the example of FIG. 22, inductance Ld) properly.

That is, the tradeoff characteristic of the surge voltage and the switching loss can be improved by setting the timing of execution of the di/dt self-feedback operation by adjusting the delay time of the delay filter ((in the example of FIG. 22, inductance Ld) properly.

The invention is not limited to the above-described particular embodiments but encompasses modifications, improvements, etc. in such ranges that the object of the invention can be attained.

For example, the application field of the invention is not limited to the driving of IGBTs but encompasses the driving of arbitrary semiconductor devices having a switching function. For example, the invention can be applied broadly to drive circuits which supply a drive signal to the gate of a semiconductor device to establish electrical continuity or disconnection in a bus by means of the semiconductor device which has such a switching function as to be turned on or off according to the voltage of a drive signal applied to the gate and whose collector and emitter are inserted in the bus. Such drive circuits is equipped with a feedback unit which generates a feedback voltage as part of the drive signal according to a temporal variation of a current flowing through the bus.

In other words, the invention can naturally be applied to inverters used in electric vehicles, trains, industrial apparatus, etc., and can also be applied to arbitrary current switches using arbitrary voltage-driven or current-driven semiconductors.

DESCRIPTION OF REFERENCE NUMERALS AND SIGNS

1: Electronic circuit
11: IGBT
12: FWD
13: Semiconductor device drive circuit
21: Gate resistor
22: Voltage source
23: di/dt feedback unit
24: Gain unit
25: Resistor
31: di/dt detecting unit
32: Gain unit
33: Voltage source
51: di/dt detecting unit
52: Gain unit
53: Voltage source
54: $I_{FWD}$ detecting unit
55: $I_{FWD}$ direction judging unit
56: Multiplier
61: Current detecting unit
62: Gain unit
63: Differentiation unit
71: Current detecting unit
72: Gain unit
73: Differentiation unit
74: Comparison unit
75: Comparison unit
76: Multiplier
77: Multiplier
121: Transformer
122: Resistor
201: LPF circuit

What is claimed is:

1. A semiconductor device driving unit which supplies, to establish electrical continuity or disconnection in a bus, a drive signal to a gate of a first semiconductor device of a series connection of the first semiconductor device and a second semiconductor device each of which has such a switching function as to be turned on or off according to a voltage of a drive signal applied to the gate, a collector and an emitter of each of which are inserted in the bus, and each of which is connected to a free wheeling diode in parallel, the semiconductor device driving unit comprising:

a feedback unit configured to generate a feedback voltage as part of the voltage of the drive signal according to a temporal variation of a current flowing through the bus, wherein the feedback unit comprises:

a turn-off feedback unit configured to generate the feedback voltage according to a temporal variation of a collector current of the first semiconductor device in a case that the first semiconductor device is turned off from on; and a turn-on feedback unit configured to generate the feedback voltage according to a commutation current flowing through the free wheeling diode connected to the second semiconductor device in a case that the first semiconductor device is turned on from off, wherein the turn-on feedback unit includes a commutation current direction detecting unit configured to detect a direction of the commutation current, and wherein the turn-on feedback unit is configured to generate the feedback voltage in a case that the commutation current detecting unit detects that the direction of the commutation current corresponds to a reverse recovery interval, and to generate no feedback voltage in other cases.

2. A semiconductor device driving method for driving at least a first semiconductor device of a series connection of the first semiconductor device and a second semiconductor device each of which has such a switching function as to be turned on or off according to a voltage of a drive signal applied to a gate, a collector and an emitter of each of which are inserted in a bus, and each of which is connected to a free wheeling diode in parallel, the method comprising:

supplying a drive signal to the gate of the first semiconductor device to establish electrical continuity or disconnection in the bus;

generating a feedback voltage as part of the voltage of the drive signal according to a temporal variation of a current flowing through the bus;

generating the feedback voltage according to a temporal variation of a collector current of the first semiconductor device when the first semiconductor device is turned off;

detecting a direction of a commutation current flowing through the free wheeling diode connected to the second semiconductor device; and generating the feedback voltage according to the commutation current when the first semiconductor device is turned on in a case that a direction of the commutation current corresponds to a reverse recovery interval, and generating no feedback voltage in other cases.

3. A semiconductor device driving unit which supplies, to establish electrical continuity or disconnection in a bus, a drive signal to a gate of a semiconductor device which has such a switching function as to be turned on or off according to a voltage of a drive signal applied to the gate and whose collector and the emitter are inserted in the bus, the semiconductor device driving unit comprising:

a buffer circuit comprising a base resistor; and a feedback unit configured to generate a feedback voltage as part of the voltage of the drive signal according to a temporal variation of a current flowing through the bus, wherein the feedback unit comprises:

a transformer a secondary side of which is connected to both ends of the base resistor of the buffer circuit.

4. The semiconductor device driving unit according to claim 3, wherein the transformer is a coreless transformer.

5. A semiconductor device driving unit which supplies, to establish electrical continuity or disconnection in a bus, a drive signal to a gate of a first semiconductor device of a series connection of the first semiconductor device and a second semiconductor device each of which has such a switching function as to be turned on or off according to a voltage of a drive signal applied to the gate, a collector and an emitter of each of which are inserted in the bus, and each of which is connected to a free wheeling diode in parallel, the semiconductor device driving unit comprising:

a feedback unit configured to generate a feedback voltage according to a temporal variation of a collector current of the first semiconductor device in a case that the first semiconductor device is turned off, to generate a feedback voltage according to a commutation current flowing through the free wheeling diode connected to the second semiconductor device in a case that the first semiconductor device is turned on, and to apply the generated feedback voltage to the gate of the first semiconductor device as part of the voltage of the drive signal, wherein the feedback unit comprises:

a delay filter configured to delay timing of application of the feedback voltage to the gate of the first semiconductor device as part of the voltage of the drive signal.

6. The semiconductor device driving unit according to claim 5, wherein the delay filter comprises two current paths in which respective rectification devices are provided in opposite directions.

7. A semiconductor device driving method for driving at least a first semiconductor device of a series connection of the first semiconductor device and a second semiconductor device each of which has such a switching function as to be turned on or off according to a voltage of a drive signal applied to a gate, a collector and an emitter of each of which are inserted in a bus, and each of which is connected to a free wheeling diode in parallel, the method comprising:

supplying a drive signal to the gate of the first semiconductor device to establish electrical continuity or disconnection in the bus;

when the first semiconductor device is turned off, generating a feedback voltage according to a temporal variation of a collector current of the first semiconductor device and applying the generated feedback voltage to the gate of the first semiconductor device (11U) as part of the voltage of the drive signal; and when the first semiconductor device is turned on, detecting a direction of a commutation current flowing through the free wheeling diode connected to the second semiconductor device, and generating a feedback voltage according to the commutation current and applying the generated feedback voltage to the gate of the first semiconductor device as part of the voltage of the drive signal in a case that a direction of the commutation current corresponds to a reverse recovery interval, and generating no feedback voltage in other cases.

\* \* \* \* \*